(12) United States Patent
Yu et al.

(10) Patent No.: US 11,195,951 B2
(45) Date of Patent: Dec. 7, 2021

(54) SEMICONDUCTOR DEVICE WITH SELF-ALIGNED WAVY CONTACT PROFILE AND METHOD OF FORMING THE SAME

(71) Applicant: Taiwan Semiconductor Manufacturing Co., Ltd., Hsinchu (TW)

(72) Inventors: Chia-Ta Yu, Hsinchu (TW); Yen-Chieh Huang, Tainan (TW); Wei-Yuan Lu, Taipei (TW); Feng-Cheng Yang, Hsinchu County (TW); Yen-Ming Chen, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/656,619

(22) Filed: Oct. 18, 2019

(65) Prior Publication Data
US 2020/0168735 A1    May 28, 2020

Related U.S. Application Data

(60) Provisional application No. 62/771,630, filed on Nov. 27, 2018.

(51) Int. Cl.
  *H01L 29/78* (2006.01)
  *H01L 27/088* (2006.01)
  (Continued)

(52) U.S. Cl.
  CPC .. *H01L 29/7848* (2013.01); *H01L 21/823418* (2013.01); *H01L 21/823431* (2013.01);
  (Continued)

(58) Field of Classification Search
  CPC ............ H01L 29/7848; H01L 29/0847; H01L 29/165; H01L 29/7851; H01L 21/823418; H01L 21/823431
  See application file for complete search history.

(56) References Cited

U.S. PATENT DOCUMENTS 8,772,109 B2   7/2014 Colinge
8,785,285 B2   7/2014 Tsai et al.
(Continued)

OTHER PUBLICATIONS

Li, Y. X. et al., "Fabrication of a Single Crystalline Silicon Capacitive Lateral Accelerometer Using Micromachining Based on Single Step Plasma Etching," Proceedings IEEE Micro Electro Mechanical Systems, Amersterdam, Netherlands, Jan. 29-Feb. 2, 1995, pp. 398-403.

*Primary Examiner* — Marc Anthony Armand
(74) *Attorney, Agent, or Firm* — Haynes and Boone, LLP

(57) ABSTRACT

A semiconductor device and method of manufacturing the semiconductor device are provided. An exemplary semiconductor device comprises a fin disposed over a substrate, wherein the fin includes a channel region and a source/drain region; a gate structure disposed over the substrate and over the channel region of the fin; a source/drain feature epitaxially grown in the source/drain region of the fin, wherein the source/drain feature includes a top epitaxial layer and a lower epitaxial layer formed below the top epitaxial layer, and the lower epitaxial layer includes a wavy top surface; and a contact having a wavy bottom surface matingly engaged with the wavy top surface of the lower epitaxial layer of the source/drain feature.

20 Claims, 16 Drawing Sheets

(51) Int. Cl.
  *H01L 21/8234*    (2006.01)
  *H01L 29/08*      (2006.01)
  *H01L 29/165*     (2006.01)

(52) U.S. Cl.
  CPC ...... *H01L 27/0886* (2013.01); *H01L 29/0847* (2013.01); *H01L 29/165* (2013.01); *H01L 29/7851* (2013.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 10,566,246 B1 * | 2/2020 | Wu ........................ H01L 29/456 |
| 2017/0076973 A1 * | 3/2017 | Lee ........................ H01L 29/161 |
| 2017/0256639 A1 * | 9/2017 | Lee ........................ H01L 29/785 |

* cited by examiner

105 — Receive a substrate with a fin and an isolation structure.

110 — Form a dummy gate structures including a dummy gate stack and spacers over the fin.

115 — Epitaxially grow a source/drain (S/D) feature in the S/D region of the fin, wherein the S/D feature comprises a top layer of pentavalent silicon compound different than the material of other layer(s) of the S/D feature.

120 — Perform metal gate replacement process to replace dummy gate stack with a metal gate stack.

125 — Form S/D contact over the S/D region of the fin, wherein the S/D contact and the epitaxial S/D feature are engaged at a waving surface.

130 — Perform other process to complete fabrication.

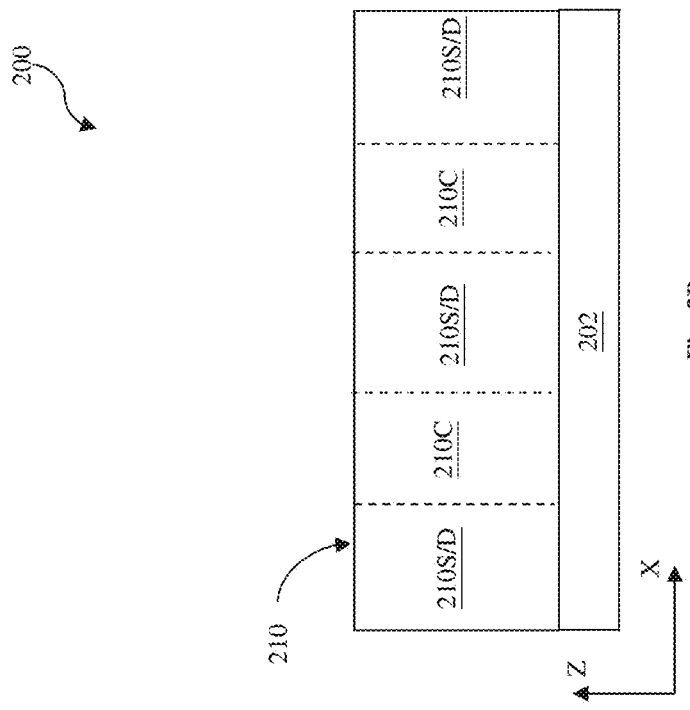
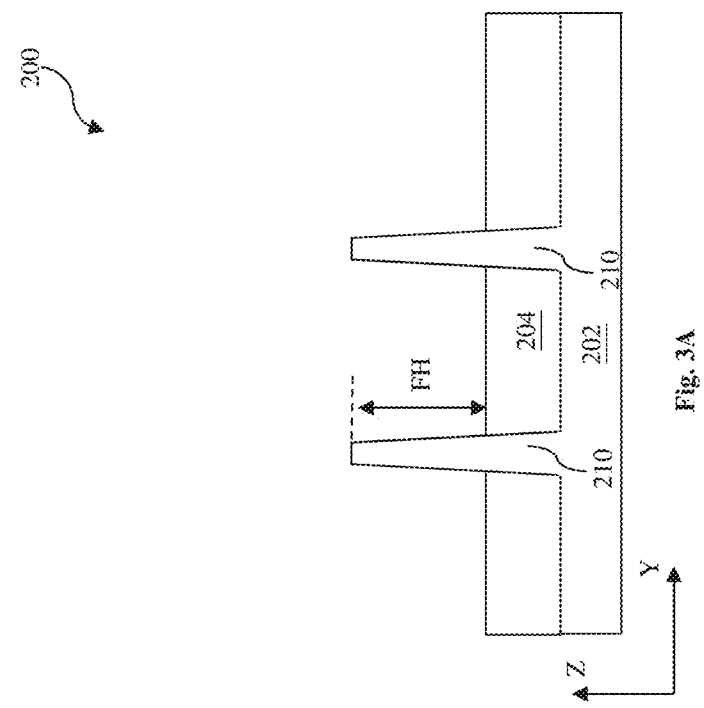

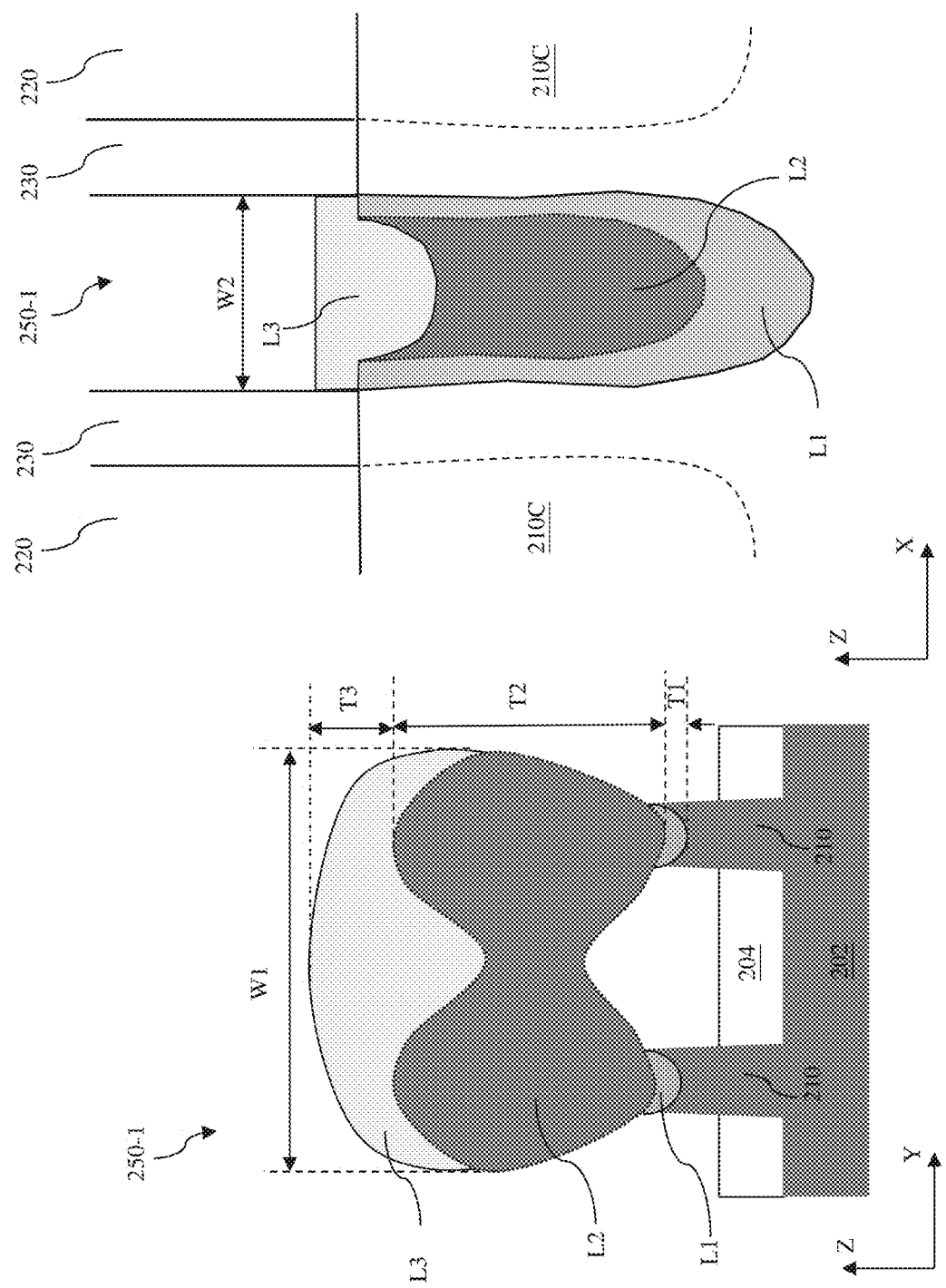

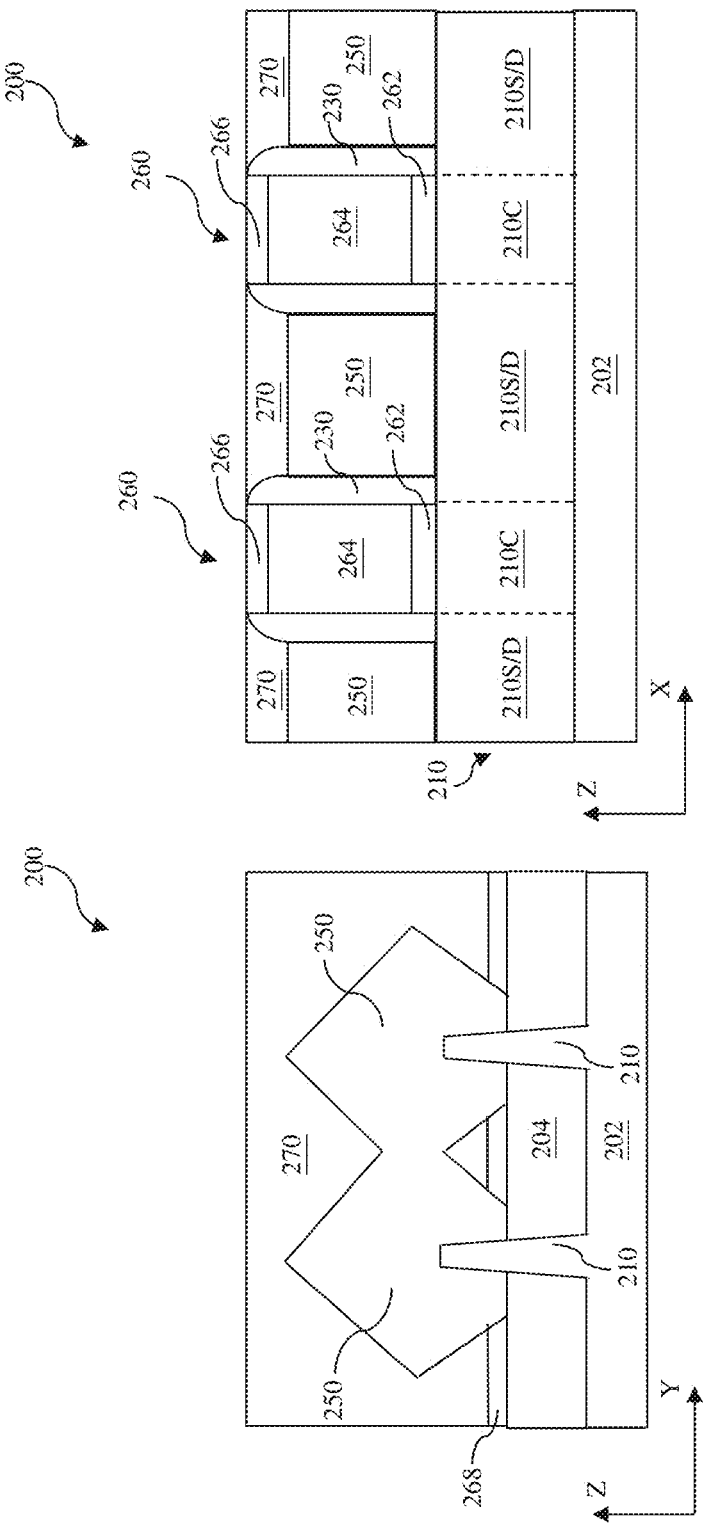

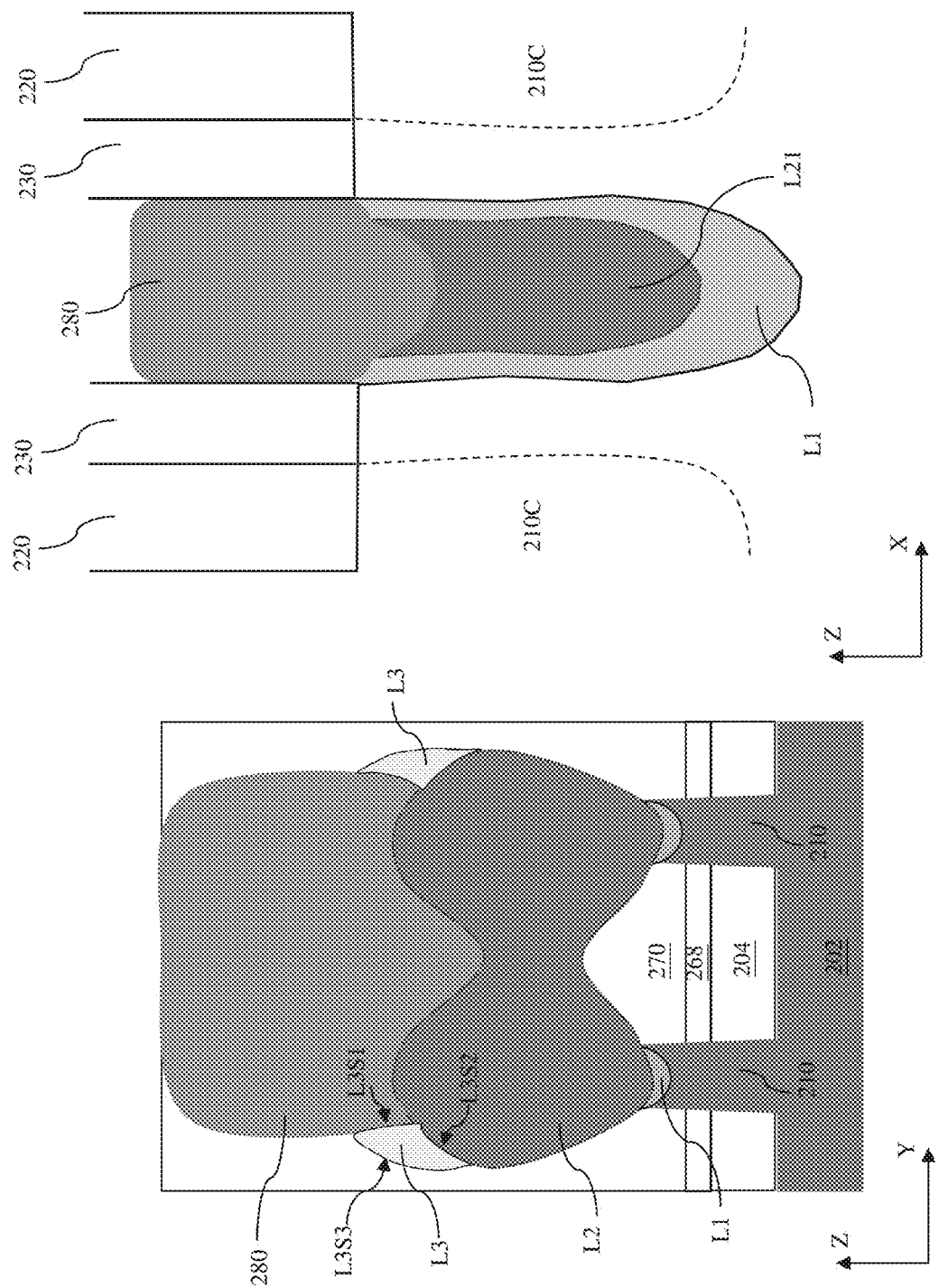

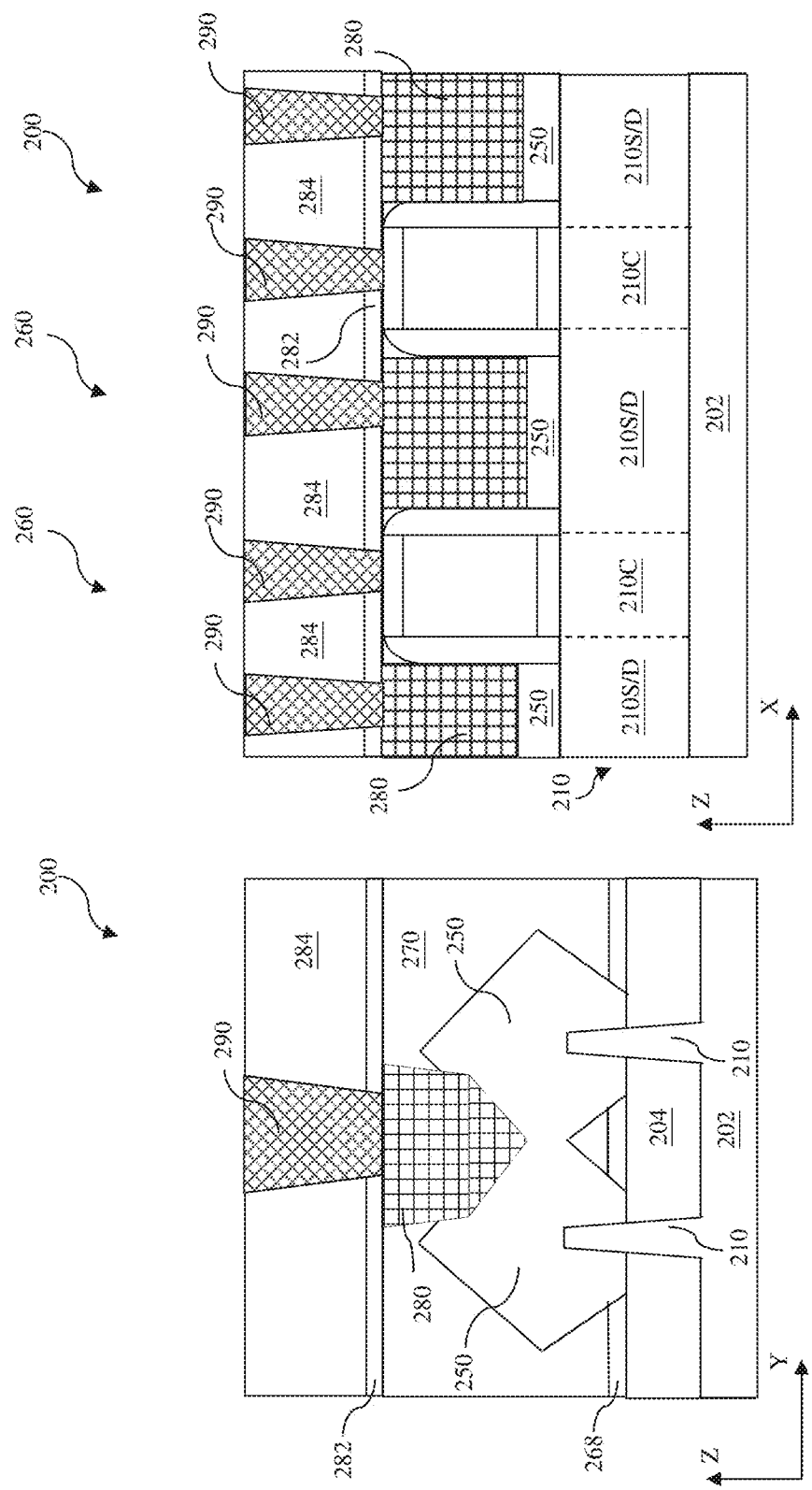

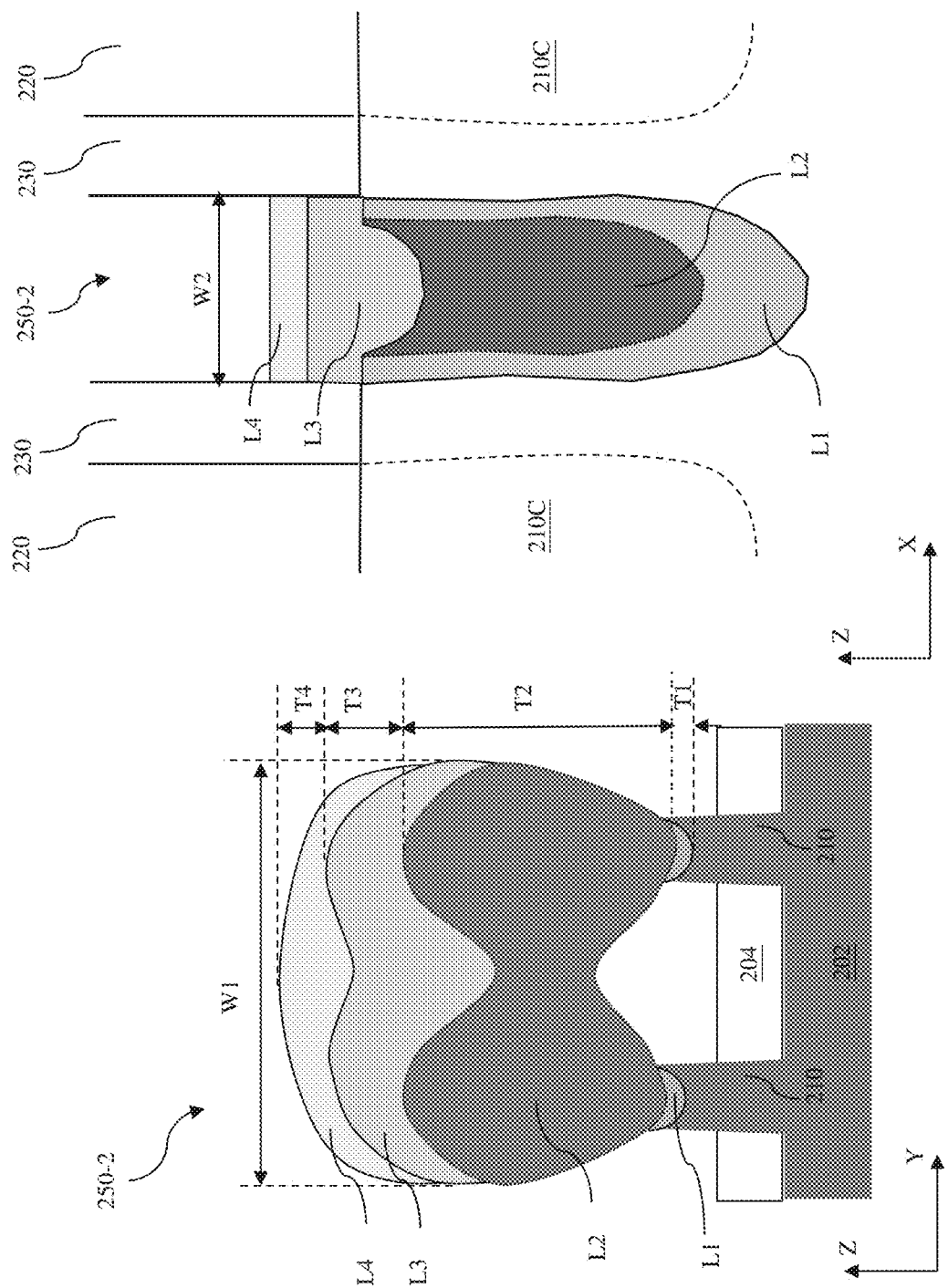

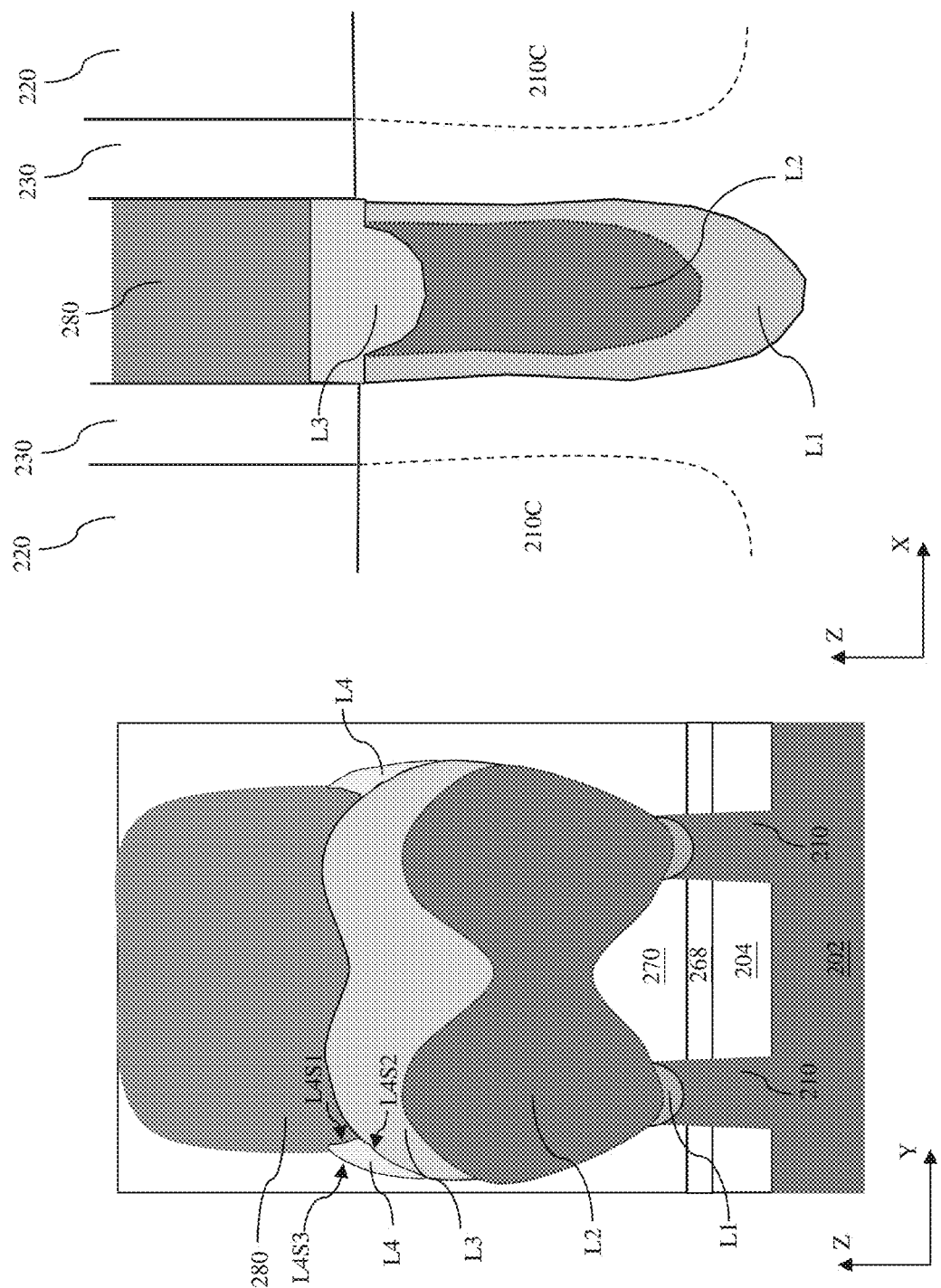

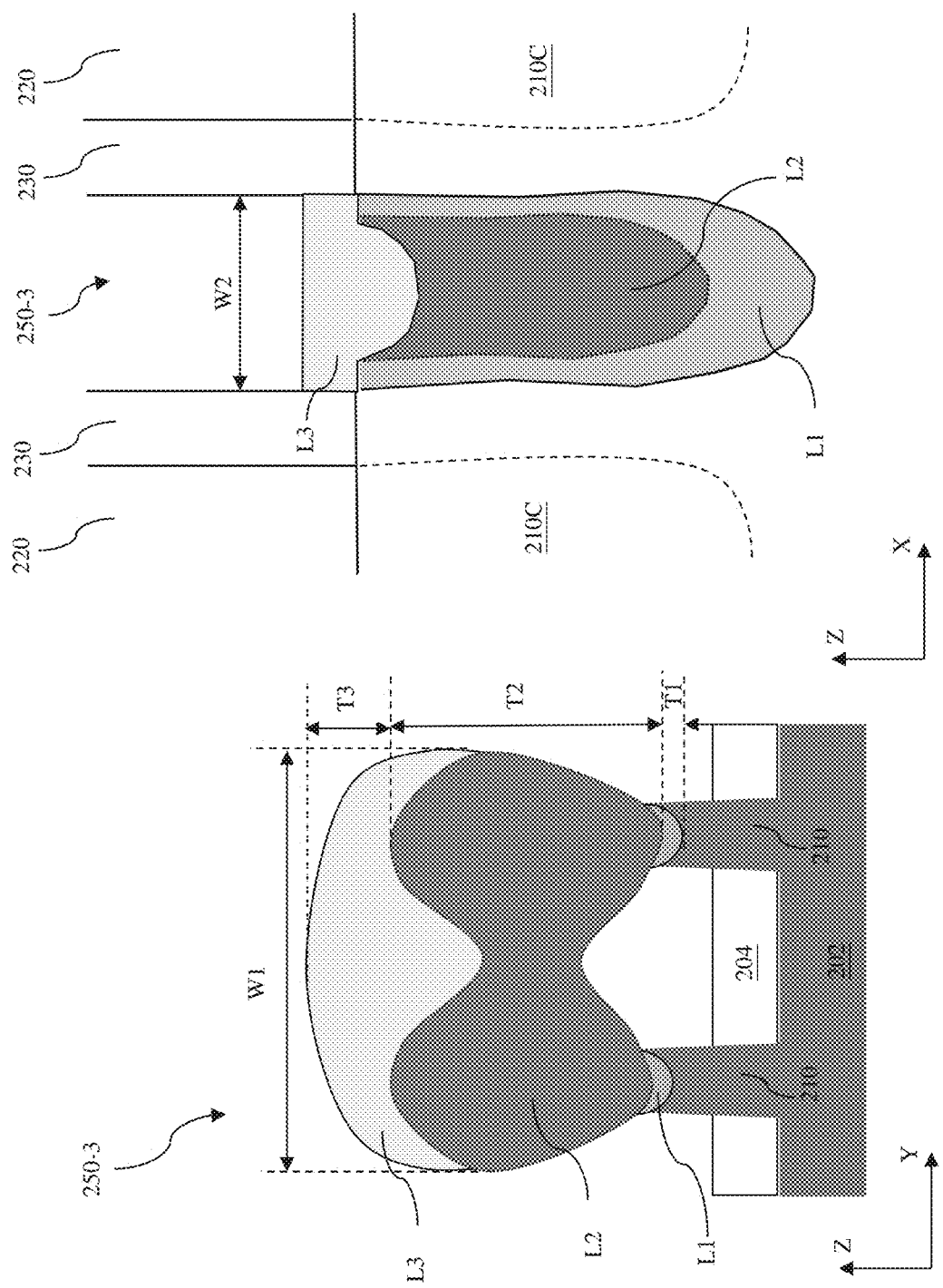

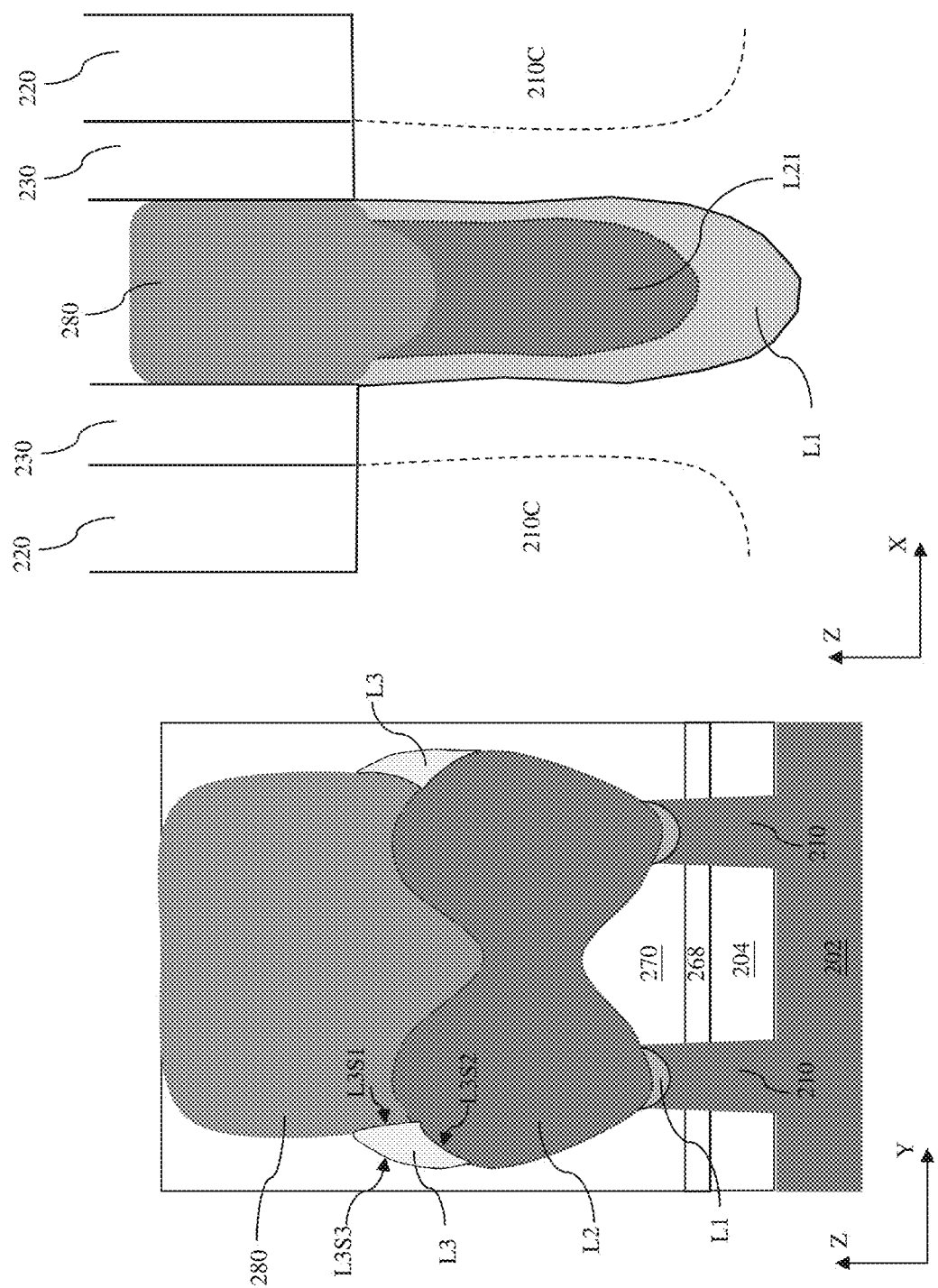

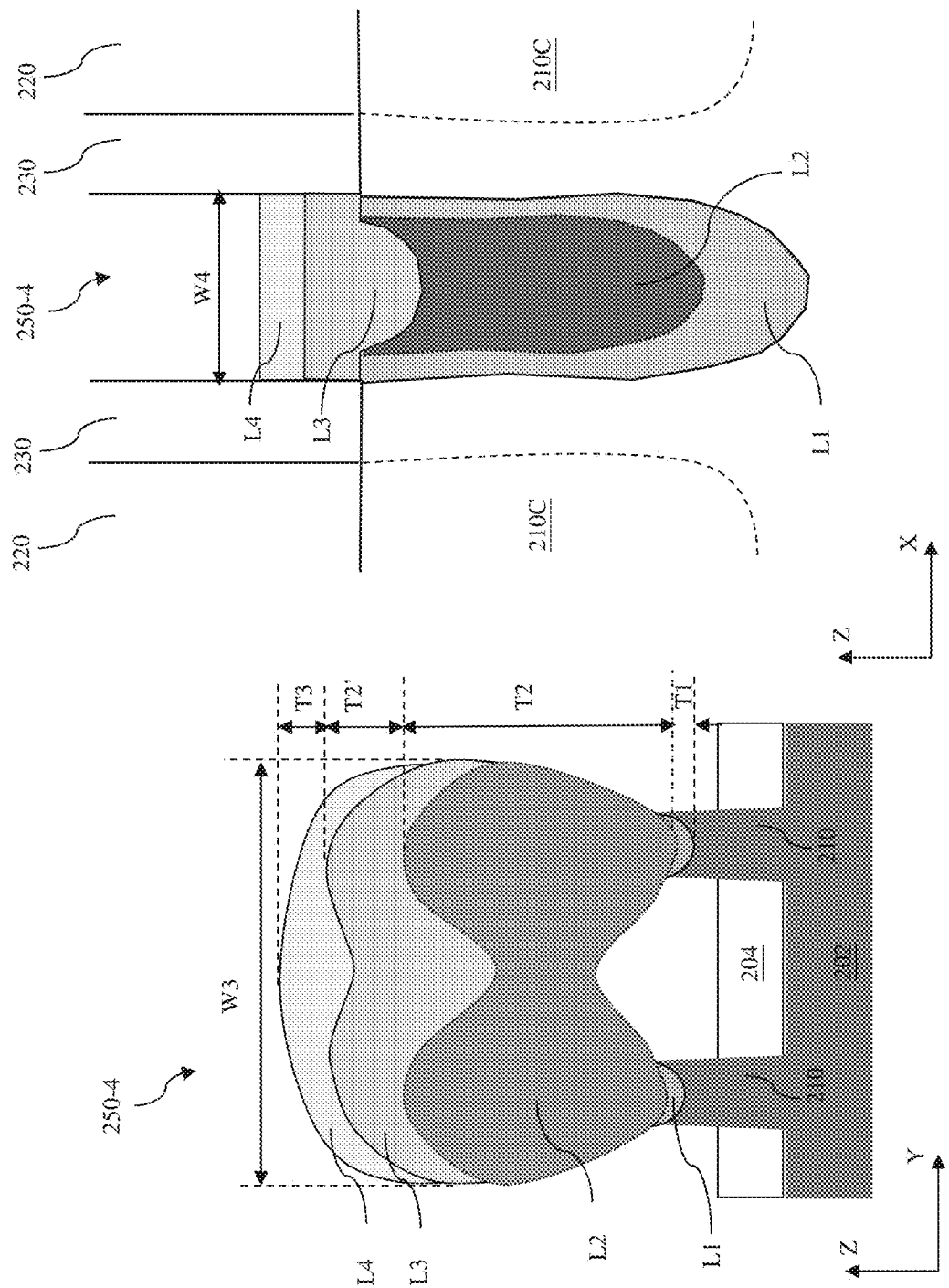

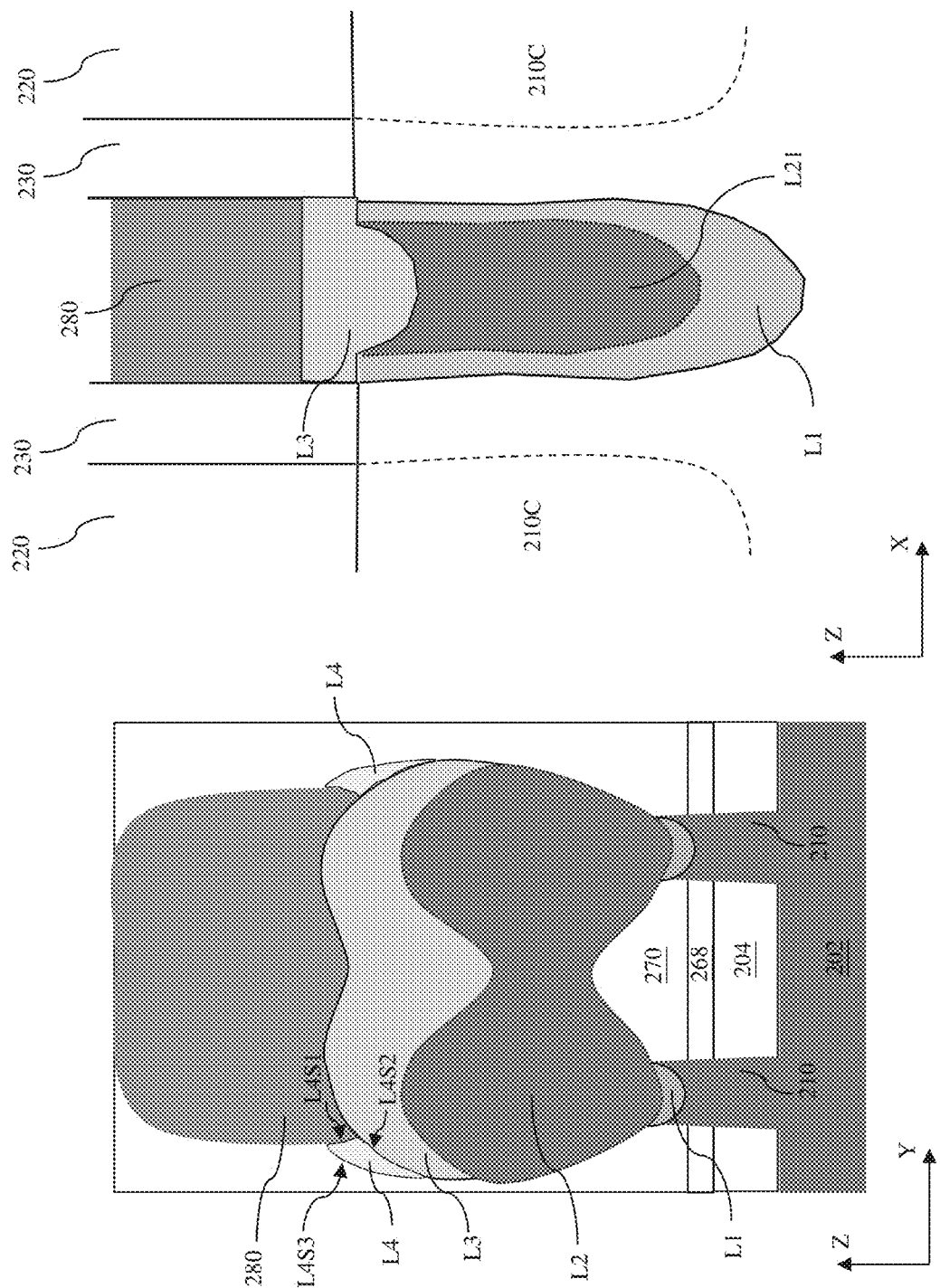

SEMICONDUCTOR DEVICE WITH SELF-ALIGNED WAVY CONTACT PROFILE AND METHOD OF FORMING THE SAME

PRIORITY DATA

This is a non-provisional application of and claims benefit of U.S. Provisional Patent Application Ser. No. 62/771,630, filed Nov. 27, 2018, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as fin-like field effect transistor (FinFET) technologies progress towards smaller feature sizes, various source/drain (S/D) materials, for example, silicon germanium (SiGe), silicon phosphide (SiP) or silicon carbide (SiC), have been explored to enhance carrier mobility for FinFETs. However, it has been observed that epitaxy source/drain features may be damaged or loss during the S/D contact etching process and S/D contact area is limited in conventional FinFET fabrication. Accordingly, improvements are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 is a flowchart of an example method for making a semiconductor device in accordance with some embodiments of the present disclosure.

FIGS. 3A-16A are cross-sectional views of various embodiments of a portion of the semiconductor device in FIG. 2, along the "A-A" line, in intermediate stages of fabrication according to an embodiment of the method in FIG. 1.

FIGS. 3B-16B are cross-sectional views of various embodiments of a portion of the semiconductor device in FIG. 2, along the "B-B" line, in intermediate stages of fabrication according to an embodiment of the method in FIG. 1.

DETAILED DESCRIPTION

Figure 2:
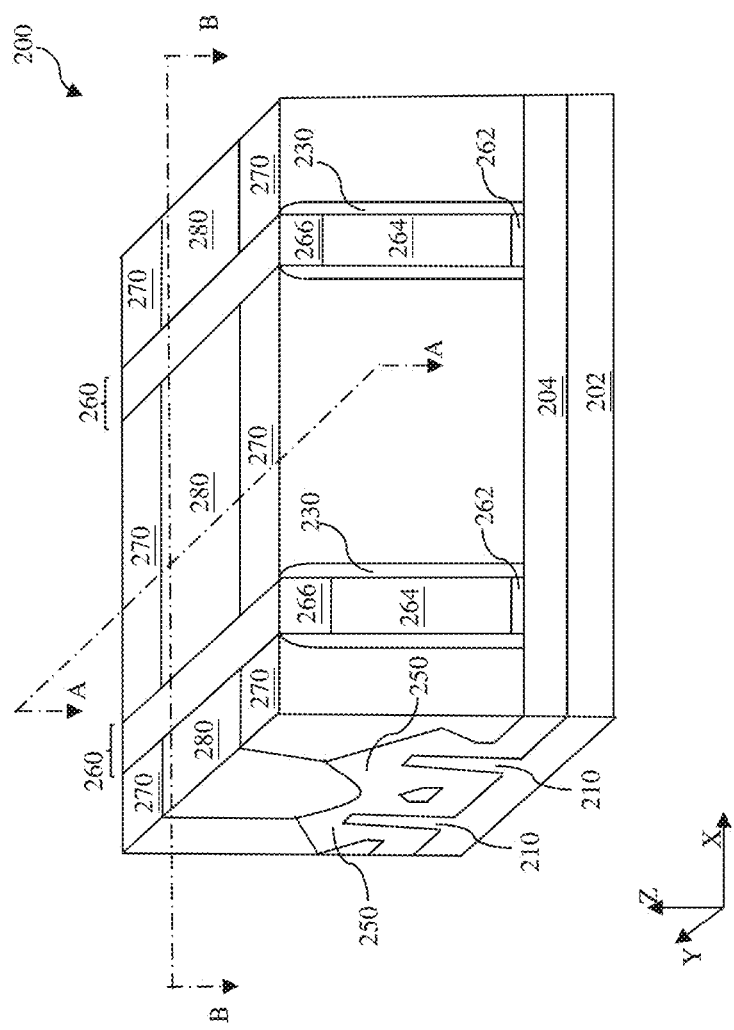
FIG. 2 is a three-dimensional perspective view of an example semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to epitaxial S/D features fabrication of field-effect transistors (FETs), such as Fin-like FETs (FinFETs). According to some aspects of the present disclosure, the epitaxial S/D feature of the semiconductor device comprises a top layer of silicon arsenide (SiAs) or other pentavalent silicon compound different than the material of other layers of the epitaxial S/D feature and can be etched anisotropically so that the later formed S/D contact may form a self-aligned wavy contact profile (having at least two crests and a valley between and below the two crests) to reduce the source/drain resistance. With the protection of the different top layer material, the epitaxial S/D feature damage or loss may be mitigated during the S/D contact etching process, thus the performance of the semiconductor device is improved.

FIG. 1 illustrates a flow chart of a method 100 for forming a semiconductor device (hereafter called "device" in short) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various three-dimensional, planar top views, and cross-sectional views of an example device 200 during intermediate steps of method 100. In particular, FIG. 2 illustrates a three-dimensional view of device 200. FIGS. 3A-16A illustrate cross-sectional views of various embodiments of device 200 of FIG. 2 taken along line A-A (along a Y-direction) at intermediate stages of method 100 in accordance with some embodiments of the present disclosure. FIGS. 3B-16B illustrate cross-sectional views of various embodiments of device 200 of FIG. 2 taken along line B-B (along an X-direction) at intermediate stages of method 100 in accordance with some embodiments of the present disclosure.

Device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), fin-like FETs (FinFETs), gate-all-around FETs (GAA FETs), metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an integrated circuit (IC). In some embodiments, device 200 may be a portion of an IC chip, a system on chip (SoC), or portion thereof. The present disclosure is not limited to any particular number of devices or device regions, or to any particular device configurations. For example, though device 200 as illustrated is a three-dimensional FET device (e.g., a FinFET), the present disclosure may also provide embodiments for fabricating planar FET devices.

Referring to FIG. 2, a semiconductor device 200 includes one or more fins 210 protruding from a substrate 202 and separated by an isolation structure 204, and one or more gate stacks 260 disposed over substrate 202 and fins 210. Gate stacks 260 defines a channel region (covered by the gate stacks 260), a source region and a drain region of fins 210. Gate spacers 230 disposed along sidewalls of gate stacks 260. Gate stacks 260 may include components such as one or more gate dielectric layers 262 disposed over isolation structure 204 and substrate 202, a barrier layers (not shown), a glue layer (not shown), a gate electrode 264 disposed over gate dielectric layers 262, and one or more hard mask layers 266 disposed over gate electrode 264, other suitable layers, or combinations thereof. Device 200 also include source/drain features 250 epitaxially grown over source/drain (S/D) regions of fins 210. Device 200 may also comprise an interlayer dielectric (ILD) layer 270 deposited over substrate 202, isolation structure 204, fins 210, and source/drain structures 250. Source/drain contacts 280 are formed over epitaxial S/D features 250 in the source/drain region of fins 210. Forming of device 200 is discussed in method 100 of FIG. 1 along with different views of device 200 at intermediate stages of method 100 as illustrated in FIGS. 3A-15A and 3B-15B.

Referring to FIGS. 1 and 3A-3B, at operation 105, a substrate 202 is provided and one or more fins 210 are formed over substrate 202. Lower portions of fins 210 are separated by an isolation structure 204.

In the depicted embodiment of FIG. 3A-3B, device 200 comprises a substrate (wafer) 202. In the depicted embodiment, substrate 202 is a bulk substrate that includes silicon. Alternatively or additionally, the bulk substrate includes another elementary semiconductor, a compound semiconductor, an alloy semiconductor, or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 may include various doped regions. In some embodiments, substrate 202 includes n-type doped regions (for example, n-type wells) doped with n-type dopants, such as phosphorus (for example, $^{31}$P), arsenic, other n-type dopant, or combinations thereof. In some embodiments, substrate 202 includes p-type doped region (for example, p-type wells) doped with p-type dopants, such as boron (for example, $^{11}$B, BF2), indium, other p-type dopant, or combinations thereof. An ion implantation process, a diffusion process, and/or other suitable doping process can be performed to form the various doped regions.

Semiconductor fins 210 are formed over substrate 202. Each fin 210 may be suitable for providing an n-type FET or a p-type FET. Fins 210 are oriented substantially parallel to one another. Each of fins 210 has at least one channel region 210C and at least one source region and drain region (both refer to source/drain region 210S/D) defined along their length in the X-direction, where the at least one channel region 210C is covered by gate structures and is disposed between the source/drain regions 210S/D. In some embodiments, fins 210 are portions of substrate 202 (such as a portion of a material layer of substrate 202). For example, in the depicted embodiment, where substrate 202 includes silicon, fins 210 include silicon. Alternatively, in some embodiments, fins 210 are defined in a material layer, such as one or more semiconductor material layers, overlying substrate 202. For example, fins 210 can include a semiconductor layer stack having various semiconductor layers (such as a heterostructure) disposed over substrate 202. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on the design of device 200. Fins 210 are formed by any suitable process including various deposition, photolithography, and/or etching processes.

Isolation structure 204 is formed over substrate 202 and separates the lower portions of fins 210. Isolation structure 204 electrically isolates active device regions and/or passive device regions of device 200. Isolation structure 204 can be configured as different structures, such as a shallow trench isolation (STI) structure, a deep trench isolation (DTI) structure, a local oxidation of silicon (LOCOS) structure, or combinations thereof. Isolation structure 204 includes an isolation material, such as silicon oxide, silicon nitride, silicon oxynitride, other suitable isolation material, or combinations thereof. Isolation structure 204 is deposited by CVD, physical vapor deposition (PVD), atomic layer deposition (ALD), high density plasma CVD (HDPCVD), metal organic CVD (MOCVD), remote plasma CVD (RPCVD), PECVD, LPCVD, atomic layer CVD (ALCVD), atmospheric pressure CVD (APCVD), other suitable deposition process, or combinations thereof. In some embodiments, isolation structure 204 is formed before fins 210 are formed (an isolation-first scheme). In some other embodiments, fins 210 are formed before isolation structure 204 is formed (a fin-first scheme). A planarization process, such as a chemical mechanical polishing (CMP) process, can be performed on isolation structure 204.

In the depicted embodiment of 3A, each fin 210 has a height FH along the Z-direction. The fin height FH is a height between the top surface of STI structure 204 and the top surface of fins 210. In some embodiments, the height FH of each fin 210 is between about 50 nanometers (nm) and about 80 nm. Also, in the embodiments of FIG. 3A, each fin 210 has a relatively tapered shape, as shown. In other embodiments, the fins can be less tapered (or not tapered), or the taper can be multi-faceted. For example, a portion of the fin above the STI structure 204 can be at a greater taper angle than a portion of the fin directly surrounded by the STI structure.

Figures 4A, 4B:
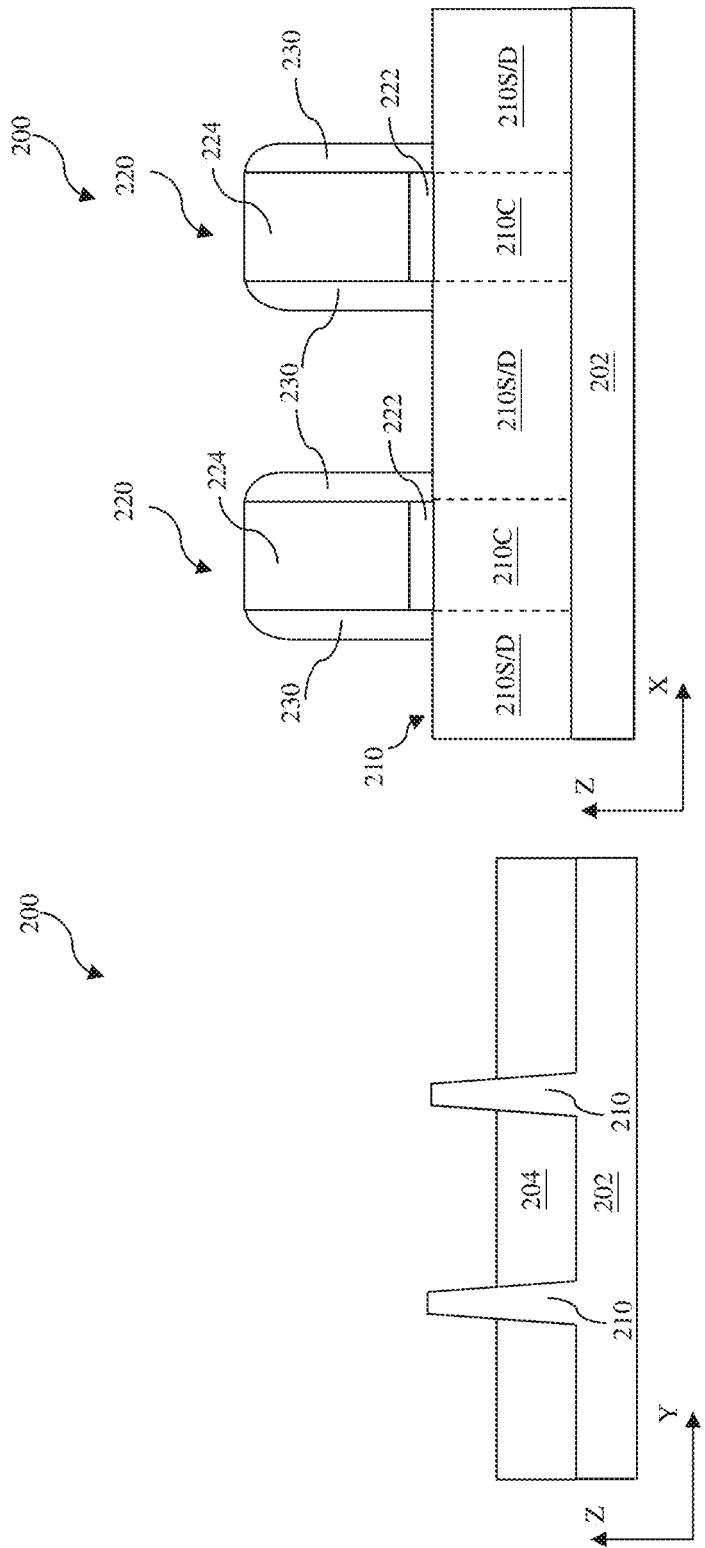

Referring to FIGS. 1 and 4A-4B, at operation 110, various dummy gate structures are formed over channel region 210C of fins 210. "Dummy gate structure" generally refers to an electrically non-functional gate structure of device 200. In some embodiments, a dummy gate structure mimics physical properties of an active gate structure, such as physical dimensions of the active gate structure, yet is relatively non-conductive (in other words, does not enable current to flow). Dummy gate structures extend along Y-direction and traverse respective fin 210. Each dummy gate structure may include a dummy gate stack 220 and spacers 230 deposited along sidewalls of dummy gate stack 220. In some embodiments, each dummy gate stack 220 includes, for example, a dummy gate dielectric layer 222 (including, for example, silicon oxide) and a dummy gate electrode 224 (including, for example, polysilicon). Dummy gate dielectric layer 222 includes a dielectric material, such as silicon oxide, a high-k dielectric material, other suitable dielectric material, or combinations thereof. High-k dielectric material generally refers to dielectric materials having a high dielectric constant, for example, greater than that of silicon oxide (k≈3.9). Dummy gate stacks 220 can include numerous other layers, for example, capping layers, interface layers, diffusion layers, barrier layers, hard mask layers, or combinations thereof. Dummy gate stacks 220 are formed by deposition processes, lithography processes, etching processes, other suitable processes, or combinations thereof.

Each dummy gate structure may include spacers 230 formed along sidewalls of dummy gate stack 220. In some embodiments, spacers 230 comprise a single layer dielectric material. In some other embodiments, spacers 230 may comprise a multi-layer structure comprising different dielectric materials with different etching selectivity. The dielectric material can include silicon, oxygen, carbon, nitrogen, other suitable material, or combinations thereof (for example, silicon oxide, silicon nitride, silicon oxynitride, silicon carbide, or silicon carbonitride). Spacers 230 are formed by any suitable process. For example, in the depicted embodiment, a spacer layer may be deposited conformally over substrate 202, isolation structure 204, dummy gate stacks 220 and fins 210. Subsequently, the spacer layer is anisotropically etched to form spacers 230 along dummy gate stacks 220.

Figures 5A, 5B:
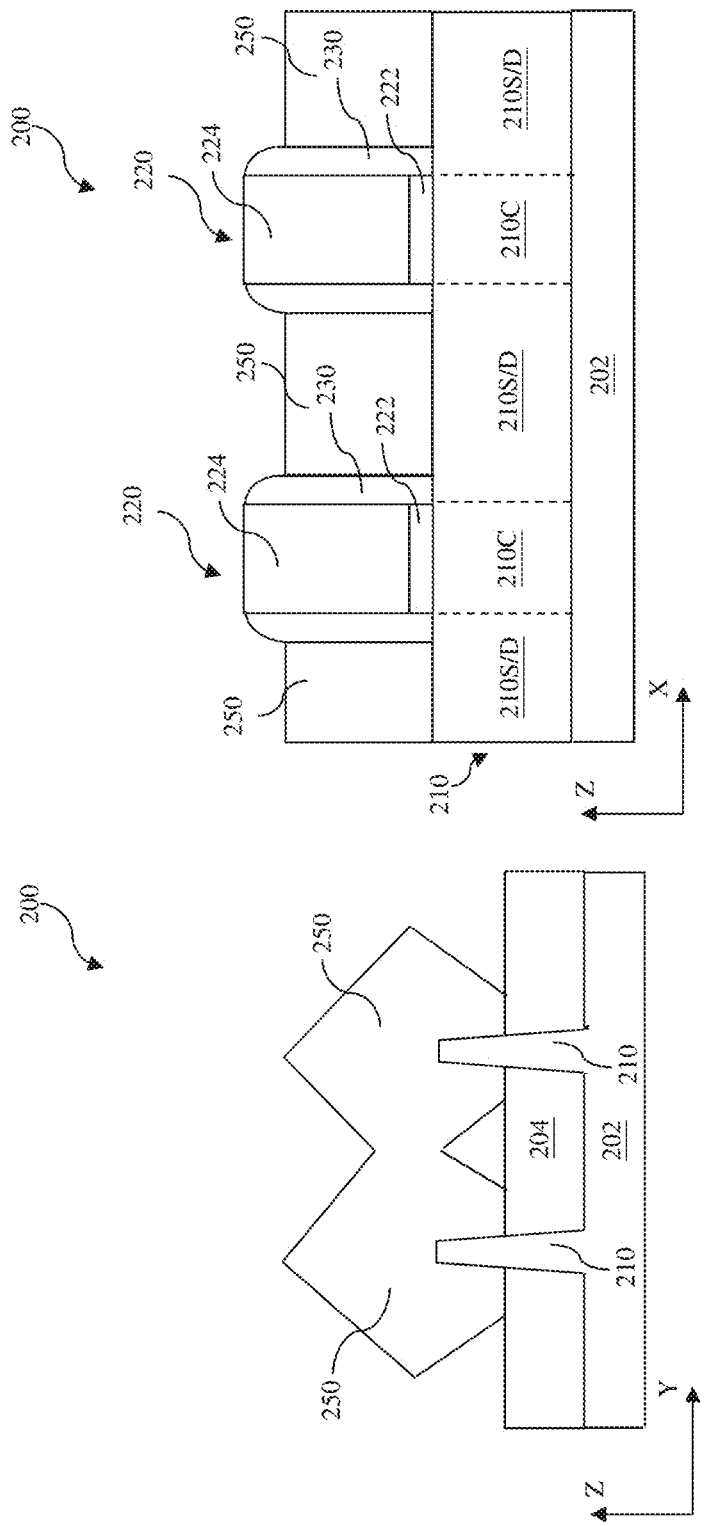

Referring to FIGS. 1 and 5A-5B, at operation 115, source/drain features 250 are epitaxially grown in the source/drain region 210S/D of fins 210. In some embodiments, semiconductor material is epitaxially grown on fins 210, forming epitaxial S/D features 250. In some embodiments, a fin recess process (for example, an etch back process) is performed on source/drain regions 210S/D of fins 210, such that epitaxial S/D features 250 are grown from lower fin active regions. In some other embodiments, source/drain regions 210S/D of fins 210 are not subjected to a fin recess process, such that epitaxial S/D features 250 are grown from and wrap at least a portion of upper fin active regions.

In some embodiments, epitaxial S/D features 250 comprises one or more epitaxial layers grown on S/D regions 210S/D of fins 210. For example, a first epitaxial layer is deposited on the top and sidewall surfaces of the S/D regions of fins 210. In other words, the first epitaxial layer wraps around S/D regions 210S/D of fins 210. Further, a second epitaxial layer wraps around the first epitaxial layer. In some further embodiments, a third and/or a fourth epitaxial layer may further wrap around the prior epitaxial layer.

Depending on the lateral distance (along the Y-direction) between two adjacent fins 210 and the control of the epitaxial growth, epitaxial S/D features 250 may be formed to have different merging profiles. In some embodiments, epitaxial S/D features 250 are grown around each fin 210, separately. That is, each epitaxial S/D features 250 is separated and none of the epitaxial layers is merged (i.e., touch each other). In some other embodiments, as depicted in FIG. 5A, epitaxial S/D features 250 forming around fins 210 are laterally merged together along the Y-direction and span more than one fin 210. In a further embodiment, the inner epitaxial layer (for example, the first epitaxial layer of a two-layer epitaxial S/D feature) on fins 210 do not merge, but the outer epitaxial layer (for example, the second epitaxial layer of a two-layer epitaxial S/D feature) on fins 210 may laterally merge together. In another further embodiment, both the inner epitaxial layer(s) and the outer epitaxial layer(s) on the two adjacent fins 210 laterally merge. In some embodiments, to form the structure that both the inner and outer epitaxial layers laterally merge, the operation 115 waits until the inner epitaxial layer(s) laterally merge before growing the outer epitaxial layer(s).

Epitaxial S/D features 250 may comprise semiconductor materials such as silicon (Si), phosphorus (P), silicon phosphide (SiP), silicon carbide (SiC), germanium (Ge), silicon germanium (SiGe), one or more III-V materials, a compound semiconductor, or an alloy semiconductor. In some embodiments, epitaxial S/D features 250 are doped with n-type dopants and/or p-type dopants. For example, in an n-type FinFET region, epitaxial S/D features 250 may include epitaxial layers including silicon and/or carbon, where silicon-containing epitaxial layers or silicon-carbon-containing epitaxial layers are doped with phosphorous, arsenic, other n-type dopant, or combinations thereof (for example, forming an Si:P epitaxial layer, an Si:C epitaxial layer, or an Si:C:P epitaxial layer). In furtherance of the example, in a p-type FinFET region, epitaxial S/D features 250 may include epitaxial layers including silicon and/or germanium, where the silicon germanium containing epitaxial layers are doped with boron, carbon, other p-type dopant, or combinations thereof (for example, forming an Si:Ge:B epitaxial layer or an Si:Ge:C epitaxial layer). In some embodiments, epitaxial S/D features 250 include materials and/or dopants that achieve desired tensile stress and/or compressive stress in the channel regions. In various embodiments, different epitaxial layer(s) of epitaxial S/D features 250 may comprise same or different semiconductor materials. Different embodiments of epitaxial S/D features 250 will be discussed in FIGS. 6A-6B, 11A-11B, 13A-13B, and 15A-15B.

An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. In some implementations, epitaxial S/D features 250 are doped during deposition by adding impurities to a source material of the epitaxy process. In some implementations, epitaxial S/D features 250 are doped by an ion implantation process subsequent to a deposition process. In some implementations, annealing processes are performed to activate dopants in epitaxial S/D features 250 and/or other source/drain features of device 200.

As shown in FIG. 5A, the epitaxial S/D features 250 can have a relatively-diamond shaped cross-section, with a significant portion existing above the fin 210. In other embodiments, the features can be more rounded and curved in shape, and/or may have a relatively small portion (or no portion) existing above the fin.

Referring to FIGS. 6A and 6B, at operation 115, in an embodiment of an n-type FinFET region, a merged epitaxial S/D feature 250-1 wrapping around two adjacent fins 210 is formed. In other words, epitaxial S/D feature 250-1 is a merged S/D feature across two adjacent fins 210. In the depicted embodiment, fins 210 comprise Si, and epitaxial S/D features 250-1 is a three-layer epitaxial S/D feature comprising three different epitaxial layers L1, L2, and L3. In the depicted embodiment, epitaxial S/D feature 250-1 comprises a first epitaxial layer L1 comprising silicon phosphide (SiP). In some other embodiments, first epitaxial layer L1 may comprise Si or SiC. In the depicted embodiment, each first epitaxial layer L1 respectively wraps an upper active region of each fin 210. The first epitaxial layers L1 do not merge or across adjacent fins. Epitaxial S/D features 250-1 further comprises a second epitaxial layer L2 comprising SiP and wrapping around the first epitaxial layer L1. In this embodiment, the material SiP in the second epitaxial layer L2 has a different etching selectivity than the SiP included in the first epitaxial layer L1. For example, the first epitaxial layer L1 comprises SiP having a P doping concentration of about $5\times10^{20}$ to about $5\times10^{21}$ atoms/cm$^3$ (a molar ratio of P is less than about 2%); and the second epitaxial layer L2 comprises SiP having a P doping concentration of about $5\times10^{21}$ to about $5\times10^{22}$ atoms/cm$^3$ (a molar ratio of P is about 2% to about 10%). In the depicted embodiment, the second epitaxial layer L2 is a merged epitaxial layer with a cross-section shape as two merged rounded diamond shapes. The second epitaxial layer L2 has a wavy top surface and a wavy bottom surface as depicted in FIG. 6A, wherein the wavy top surface has at least two crests and a valley between and below the two crests, and the wavy bottom surface has two valleys and a crest between and above the two valleys.

Epitaxial S/D feature 250-1 further comprises a third epitaxial layer L3, which is the top epitaxial layer comprising silicon arsenide (SiAs). In some embodiments, the third (top) epitaxial layer L3 comprises SiAs having an As doping concentration of about $1\times10^{22}$ to about $1\times10^{23}$ atoms/cm$^3$. In some embodiments, a molar ratio of As in the third epitaxial layer L3 is about 2% to about 10%. In some other embodiments, another pentavalent may be used to form the silicon compound in the third epitaxial layer L3 (such as antimony (Sb), Bismuth (Bi), moscovium (Mc), other pentavalent silicon compound, or combinations thereof) so that the semiconductor material of top epitaxial layer L3 is different from the semiconductor material of the second epitaxial layers L2 and has an etching selectivity different from that of the semiconductor material of the second epitaxial layer L2. As depicted in FIG. 6A, the third epitaxial layer L3 is directly formed over the second epitaxial layer L2 and the bottom surface of the third epitaxial layer L3 matches (e.g., is coplanar with) the top surface of the second epitaxial layer L2, both have the same wave profile. As depicted in FIG. 6B, the third epitaxial layer L3 contacts both the first epitaxial layer L1 and the second epitaxial layer L2 in the X-direction.

Epitaxial S/D features 250-1 is formed by an epitaxial growth process. The epitaxial growth process may be a LPCVD process with a silicon-based precursor, a selective epitaxial growth (SEG) process, a cyclic deposition and etching (CDE) process, other suitable processes, or combinations thereof. For example, silicon phosphide crystal may be formed with a chemical gas ($Si_3H_8$, $SiH_3CH_3$ and/or $PH_3$) based deposition process combined with a selective chemical vapor etch process. For another example, silicon crystal may be grown with LPCVD with dichlorosilane ($SiH_2Cl_2$) as the precursor. The precursor may be doped in-situ (during the epitaxial growth process) or ex-situ (after the epitaxial growth process is completed) with n-type dopants, for example phosphorus (P) for L1 and L2 and arsenic (As) for L3, respectively, to form the different epitaxial layers of epitaxial S/D feature 250-1. In some embodiments, different epitaxial layers of epitaxial S/D feature 250-1 are doped during deposition by adding impurities to a source material of the epitaxy process. In some embodiments, different layers of epitaxial S/D feature 250-1 are doped by an ion implantation process subsequent to a deposition process. Implant energies and dosages during the ion implantation process can be configured depends on the design of device 200. For example, first epitaxial layer L1 is formed by ion implantation doping with a lower concentration of P (for example, a molar ratio of P is less than about 2%) to the silicon precursor for a thickness T1 of about 1 nm to about 10 nm; second epitaxial layer L2 is formed by ion implantation doping with a higher concentration of P (for example, a molar ratio of P is about 2% to about 10%) to the silicon precursor for a thickness T2 of about 10 nm to about 40 nm; and third epitaxial layer L3 is formed by ion implantation doping with As (for example, about $1\times10^{22}$ to about $1\times10^{23}$ atoms/cm$^3$ of As, in some embodiments, about 2% to about 10% of As) to the silicon precursor for a thickness T3 of about 0.1 nm to about 20 nm. In some embodiments, a thickness ratio of the top (third) epitaxial layer L3 to the bottom (first) epitaxial layer L1 is about 0.01 to about 20; a thickness ratio of the top (third) epitaxial layer L3 to the second epitaxial layer L2 is about 0.0025 to about 2. In some embodiment, a ratio of the thickness of the top (third) epitaxial layer L3 comprising SiAs to the height of epitaxial S/D features 250-1 (T1+T2+T3) is about 1% to about 20%. As depicted in FIGS. 6A and 6B, epitaxial S/D features 250-1 has a merge width W1 in the Y-direction and a width W2 in the X-direction. In some embodiments, the merge width W1 is about 5 nm to about 100 nm, and the width W2 is about 5 nm to about 25 nm. In some embodiments, a ratio of the thickness T3 of the top epitaxial layer L3 to a merge width W1 of epitaxial S/D features 250-1 is about 0.001 to about 4, and a ratio of the thickness T3 of the top epitaxial layer L3 to a width W2 of epitaxial S/D features 250-1 is about 0.004 to about 4. In some embodiments, annealing processes (such as rapid thermal/milli-second/laser anneal) are performed to activate dopants in epitaxial S/D features 250-1 and/or other source/drain features of device 200, such as HDD regions and/or LDD regions.

Using SiAs as the top epitaxial layer to form epitaxial S/D features for n-type FET devices provides several benefits. For example, using SiAs in the top layer (different than material of other layers) ensures a better etching selectivity than using SiP in the top layer (same/similar as material of other layers) in epitaxial S/D feature of an n-type FET device. Therefore, in a later S/D contact selective etching process, the anisotropic etching can selectively etch the wavy surface of the epitaxial S/D feature (for example, the top surface of second epitaxial layer L2) such that the S/D contact may have an enlarged wavy contact surface with the epitaxial S/D feature, thereby reducing the contact resistance between the S/D contact and the epitaxial S/D feature. Moreover, the selectivity between SiAs and SiP is relatively strong, which can mitigate any epitaxial S/D feature (for example, second epitaxial layer L2) damage or loss during the S/D contact selective etching process. Furthermore, dopant activation within SiAs may be achieved using a lower thermal budget (e.g., lower activation anneal temperature and/or time), for example, as compared to dopant activation within SiP. In some embodiments, the thermal budget used to achieve dopant activation in SiAs may be about 15-20% lower than that used to activate dopants in SiP. Additionally, in some embodiments, a doped layer formed using SiAs may be thinner than a doped layer formed using SiP. For example, a doped layer formed using SiAs may be about 0.5-0.8 times the thickness of a doped layer formed using SiP.

In an alternative fabrication process, the top epitaxial layer of the epitaxial S/D feature of an n-type device may be a layer comprises SiP, same or similar (only different in P doping concentration or molar ratio) as other layers of the epitaxial S/D feature. Even though the molar ratio or the doping concentration of SiP in the top epitaxial layer (for example, the third epitaxial layer L3 may have a P doping concentration of about $1 \times 10^{21}$ to about $5 \times 10^{21}$ atoms/cm$^3$) is different than that in the next lower epitaxial layer (for example, the second epitaxial layer L2 may having a P doping concentration of about $5 \times 10^{20}$ to about $5 \times 10^{21}$ atoms/cm$^3$), etching selectivity between the top epitaxial layer and the next lower epitaxial layer may be relatively weak. Therefore, in the later metal contact selective etching process, residual portions of the top epitaxial layer in the valley (below the crest) of the wavy surface of the next lower epitaxial layer may exist. Accordingly, the contact surface between the S/D contact and the epitaxial S/D feature may not be a wavy surface, but instead will be relatively flat and small, as compared to the wavy contact surface formed by using SiAs as the top epitaxial layer. In addition, due to the poor selectivity between the top epitaxial layer and the next lower epitaxial layer (both using SiP, although with different molar ratios), portions of the next lower epitaxial layer may be removed when S/D contact etching is performed to remove the top epitaxial layer. Thus, using of SiAs as the top epitaxial layer of epitaxial S/D features provides many benefits and can improve the performance of the semiconductor device.

Now referring to FIGS. 1 and 7A-7B, at operation 120, a metal gate replacement process is performed to replace dummy gate stack 220 with a metal gate stack 260. First, an interlayer dielectric (ILD) layer 270 is formed over substrate 202, particularly over source/drain structures 250, dummy gate structures 220, and fins 210. ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. In some embodiments, ILD layer 270 has a multilayer structure having multiple dielectric materials. In some embodiments, a etch stop layer (ESL) 268 is disposed between ILD layer 270 and source/drain structures 250, dummy gate structures 220, and/or fins 210. ESL 268 includes a dielectric material different than ILD layer 270. ILD layer 270 and/or ESL 268 are formed, for example, by a deposition process (such as CVD, FCVD, PVD, ALD, HDPCVD, MOCVD, RPCVD, PECVD, LPCVD, ALCVD, APCVD, plating, other suitable methods, or combinations thereof). Subsequent to the deposition of ILD layer 270 and/or ESL 268, a CMP process and/or other planarization process is performed until reaching (exposing) top surfaces of dummy gate structures 220.

Subsequently, dummy gate stacks 220 are removed to exposes channel regions 210C of fins 210. The removing process may be an etching process, which may include a dry etching process, a wet etching process, or combinations thereof. Thereafter, metal gate stacks 260 are formed over channel regions 210C of fins 210. Metal gate stacks 260 are formed by a proper procedure, such as a gate-last process or a high-k-last process. Each of metal gate stacks 260 may include a gate dielectric layer 262, a gate electrode 264 disposed over gate dielectric layer 262, and a hard mask layer 266 disposed over gate electrode 264. Referring to FIG. 7B, gate dielectric layer 262 is deposited over channel regions 210C of fins 210. Gate dielectric layer 262 include a dielectric material, such as silicon oxide, high-k dielectric material, other suitable dielectric material, or combinations thereof. In some embodiments, the high-k dielectric material has a dielectric constant greater than or equal to about five (k≥5). Gate dielectric layer 262 is formed by various processes, such as ALD, CVD, PVD, and/or other suitable process. Gate electrode 264 may comprise a work function layer and a metal fill layer. The work function layer may include a conductive layer of metal or metal alloy with proper work function such that the corresponding FET is enhanced for its device performance (for example, reduce the threshold voltage of the semiconductor device). The work function layer is different in composition for a p-FET and an n-FET, respectively referred to as an p-type work function (WF) metal and an n-type WF metal. The work function metal may be deposited by a suitable process, such as ALD, CVD, PVD, and/or other suitable process, over gate dielectric layer 262. The metal fill layer of gate electrode 264 may include metal such as aluminum, tungsten, copper or other suitable metal, and is disposed over work function layer by a suitable technique, such as PVD or plating. A hard mask layer 266 including, for example, silicon nitride or silicon carbide, is then disposed over gate electrode 264 by a deposition processes, such as ALD, CVD, PVD, and/or other suitable process. A CMP process can be performed to remove any excess material of metal gate stacks 260 and planarizing a top surface thereof.

Figures 8A, 8B:
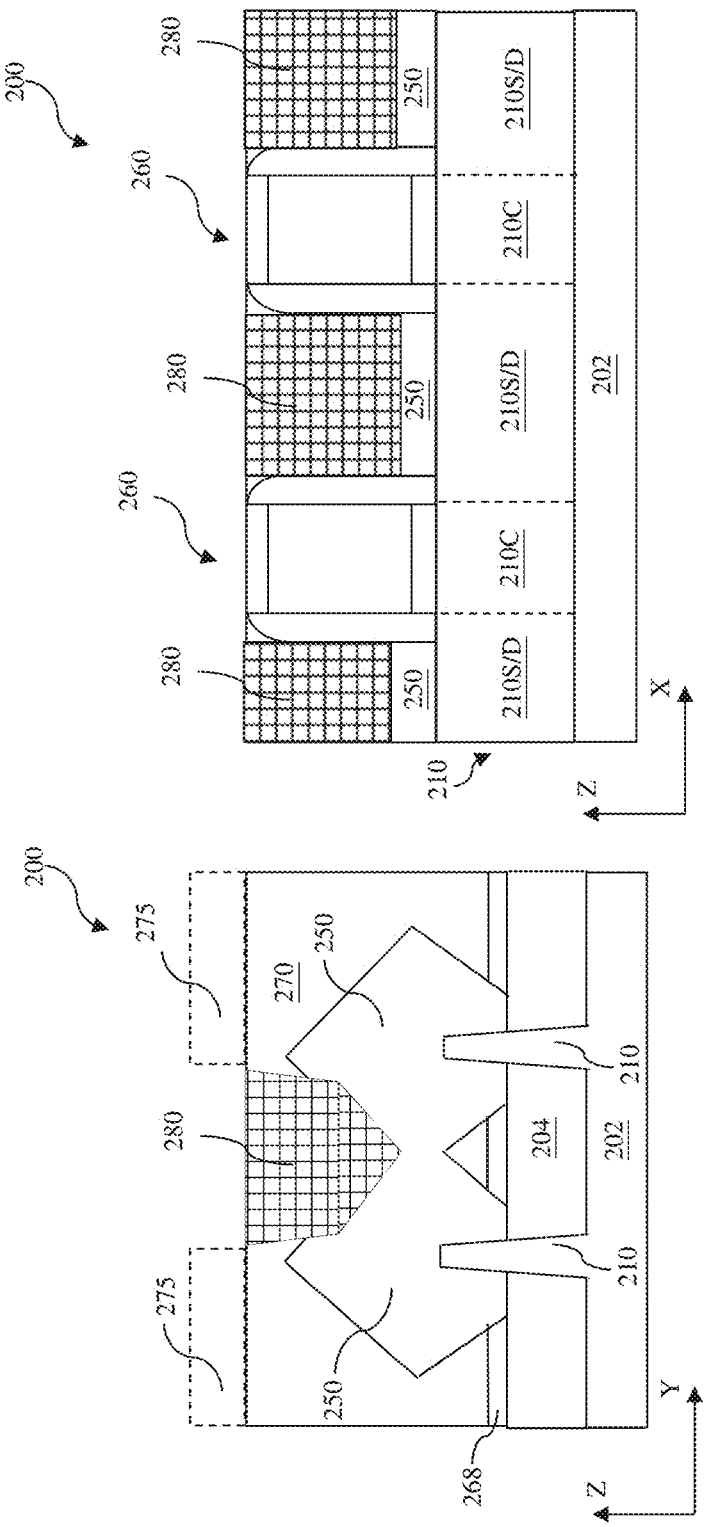

Now referring to FIGS. 1 and 8A-8B, at operation 125, source/drain (S/D) contacts 280 are formed over source/drain regions 210S/D of fins 210. In some embodiment, a photoresist mask 275 (illustrated in dashed line) is patterned to expose a landing window over source/drain regions 210S/D of fins 210 to form S/D contacts 280. Patterning mask 275 may include exposing a mask layer (for example, comprising silicon oxide, silicon nitride, or silicon oxynitride) to a pattern through a process such as photolithography, performing a post-exposure bake process, and developing the photoresist mask. Patterning may also be implemented or replaced by other proper methods, such as maskless photolithography, electron-beam writing, ion-beam writing, and molecular imprint.

Portions of ILD layer 270 and the top epitaxial layer of epitaxial S/D features 250 exposed through photoresist mask 275 are subsequently removed to form a landing window (a trench) for S/D contact 280. The removing process may include a plasma etch, a reaction ion etch (RIE), a dry etch, a wet etch, another proper removing process, or combinations thereof. For example, referring to FIGS. 8A and 8B where the top epitaxial layer L3 comprises SiAs, an anisotropical selective etch using a chlorine (Cl)-based plasma chemistry is performed. In some embodiments, the Cl-based anisotropical etch is a two-step etching process. For example, in a first step, boron trichloride ($BCl_3$, for example, about 10-20 sccm) with a certain power density (for example, about 0.1-0.5 $W/cm^2$) and pressure (for example, about 15-30 mTorr) is used to remove portions of ILD layer 270 (for example, comprising silicon oxide) in the landing window of S/D contact; in a second step, a gas mixture of $Cl_2$ (for example, about 15-25 sccm) and $BCl_3$ (for example, about 1-10 sccm) with a certain power density (for example, about 0.1-1 $W/cm^2$) and pressure (for example, about 10-20 mTorr) is used to remove portions the top epitaxial layer L3 (comprising SiAs) of epitaxial S/D features 250. In principle, undoped or lightly doped silicon is not etched by Cl atoms or $Cl_2$ molecules unless energetic ion bombardment in Cl-containing plasma is present. Thus, the Cl based plasma etch achieves a vertical (anisotropical) removal of the top epitaxial layer L3. In addition, Cl atoms are covalently bound to specific sites in the case of an undoped silicon surface, which prevents or reduces the etching of the silicon. However, in a doped (e.g., with arsenic) silicon surface, a more ionic Si—Cl bound is formed on the silicon surface which enhances electron transfer and promotes the silicon etching. Therefore, as depicted in FIGS. 9A and 9B, top epitaxial layer L3 (comprising SiAs) within the landing window (trench) is substantially removed, thus the wavy surface (having at least two crests and a valley between and below the two crests as depicted in FIG. 9A) of the second epitaxial layer L2 (comprising SiP) is exposed. In addition, because of the relatively strong selectivity between SiAs (top epitaxial layer) and SiP (second epitaxial layer), the second epitaxial layer L2 is substantially unchanged during the selective Cl-based plasma etching.

Thereafter, referring to FIGS. 8A, 8B, 9A, and 9B, S/D contacts 280 are formed within the landing window (trench) and over the wavy top surface of second epitaxial layer L2. S/D contacts 280 may comprise metals such as copper, ruthenium or cobalt. Various deposition process may be applied to deposit S/D contacts 280. For example, the deposition of the copper may include PVD to form a seed layer and plating to form bulk copper on the copper seed layer. In some embodiments, prior to filling conductive material in contact holes, silicide may be formed on the source/drain regions to further reduce the contact resistance. In some embodiments, the silicide is considered as a portion of S/D contact 280. The silicide includes silicon and metal, such as titanium silicide, tantalum silicide, nickel silicide or cobalt silicide. The silicide may be formed by a process referred to as self-aligned silicide (or salicide). The process includes metal deposition, annealing to react the metal with silicon, and etching to remove unreacted metal. As depicted in FIG. 9A, S/D contact 280 has sidewalls partially contacts sidewalls of top (third) epitaxial layer L3 and S/D contact 280 has a wavy bottom surface matches and directly contacts (matingly engaged with) the wavy top surface of second epitaxial layer L2 within the landing window (trench) formed in the top epitaxial layer L3. As depicted in FIG. 9B, S/D contact 280 contacts both the first epitaxial layer L1 and the second epitaxial layer L2 in the X-direction. In the depicted embodiment, the top (third) epitaxial layer L3 surrounds a lower portion of S/D contact 280. The top (third) epitaxial layer L3 includes three surfaces: surface L3S1 contacting the lower portion of the sidewall of S/D contact 280; surface L3S2 contacting a portion of the second epitaxial layer L2; and surface L3S3 contacting ILD 270. As depicted in FIG. 9A, the bottom surface of S/D contact 280 has substantially the same wavy profile as at least a portion of the top surface of the second epitaxial layer L2. The wavy contact surface has at least two crests and a valley between and below the two crests. The crests and the valley of the wavy contact surface enlarges the contact surface between S/D contact 280 and epitaxial feature 250-1 compare to the conventional flat contact surface between the S/D contact and the epitaxial S/D feature. Therefore, the contact resistance between the S/D contact and the epitaxial S/D feature is reduced and the performance of device 200 is improved.

Referring to FIGS. 1, 10A and 10B, at operation 130, further processing is performed to complete the fabrication of device 200. For example, various other contacts, vias (such as vias 290), metal wires, dielectric layers (such as ESL 282 and ILD 284) in a multilayer interconnect (MLI) feature are formed over substrate 202, so that the MLI feature can connect various features to form a functional circuit that may include one or more FET devices.

Using SiAs or other pentavalent silicon compound as the top epitaxial layer of epitaxial S/D features not only benefits three-layer epitaxial S/D features in a n-type device, but also other number of layers (for example, two layers or four layers) of epitaxial S/D features and/or in a p-type device. FIGS. 11A-16A and 11B-16B provide various embodiments of epitaxial S/D features and the S/D contacts having wavy profiles in device 200. FIGS. 11A-16A are cross-sectional views of a portion of device 200 along the "A-A" line, in accordance with some embodiments of the present disclosure. FIGS. 11B-16B are cross-sectional views of a portion of device 200 along the "B-B" line, in accordance with some embodiments of the present disclosure.

FIGS. 11A and 11B provides a device 200 having a four-layer epitaxial S/D feature 250-2 in an n-type region. Epitaxial S/D feature 250-2 comprises a first epitaxial layer L1, a second epitaxial layer L2, a third epitaxial layer L3, and a fourth epitaxial layer L4. In the depicted embodiment, each first epitaxial layer L1 respectively wraps an upper active region of each fin 210. The first epitaxial layers L1 do not merge or across adjacent fins. The second epitaxial layer L2 is a merged epitaxial layer and is wrapped by the first epitaxial layer L1 in the X-direction; the third epitaxial layer L3 is formed over the second epitaxial layer L2 and having a wavy bottom surface directly contact a wavy top surface of the second epitaxial layer L2; and the fourth epitaxial layer L4 is formed over the third epitaxial layer L3 and having a wavy bottom surface directly contact a wavy top surface of the third epitaxial layer L3. In the embodiment, epitaxial layers L1-L3 all comprise SiP, but with different molar ratios of P. For example, a molar ratio of P in the first epitaxial layer L1 is less than about 2%; a molar ratio of P in the second epitaxial layer L2 is about 2% to about 10%; and a molar ratio of P in the third epitaxial layer L3 is more than about 10%. In the depicted embodiment, the fourth epitaxial layer L4 is the top epitaxial layer comprising SiAs, wherein, for example, a molar ratio of As in the fourth epitaxial layer L4 is about 2% to about 10%. In some embodiments, a doping concentration of As in fourth epitaxial layer L4 is about $1 \times 10^{22}$ to about $1 \times 10^{23}$ atoms/$cm^3$. The forming process of epitaxial S/D feature 250-2 is similar to that of the epitaxial S/D feature 250-1 as previously discussed. In some embodiments, a thickness T1 of the first epitaxial layer L1 is about 1 nm to about 10 nm; a thickness T2 of the second epitaxial layer L2 is about 10 nm to about 40 nm; a thickness T3 of the third epitaxial layer L3 is about 10 nm to about 40 nm; and a thickness T4 of the fourth epitaxial layer L4 is about 0.1 nm to about 20 nm. Thus, a thickness ratio of the top (fourth) epitaxial layer L4 to the bottom (first) epitaxial layer L1 is about 0.01 to about 20; a thickness ratio of the top (fourth) epitaxial layer L4 to the second epitaxial layer L2 is about 0.0025 to about 2; and a thickness ratio of the top (fourth) epitaxial layer L4 to the third epitaxial layer L3 is about 0.0025 to about 2. In one embodiment, a ratio of the thickness of the top (fourth) epitaxial layer L4 comprising SiAs to the height of epitaxial S/D features 250-2 (T1+T2+T3+T4) is about 1% to about 20%. As depicted in FIGS. 11A and 11B, epitaxial S/D features 250-2 has a merge width W1 in the Y-direction and a width W2 in the X-direction. In some embodiments, the merge width W1 is about 5 nm to about 100 nm, and the width W2 is about 5 nm to about 25 nm. In some embodiments, a ratio of the thickness T4 of the top epitaxial layer L4 to the merge width W1 of epitaxial S/D features 250-2 is about 0.001 to about 4, and a ratio of the thickness T4 of the top epitaxial layer L4 to a width W2 of epitaxial S/D features 250-2 is about 0.004 to about 4.

Referring to FIGS. 12A and 12B, portions of top epitaxial layer L4 comprising SiAs is removed by a process, for example, an anisotropical chlorine-based plasma etching process as previously discussed. Therefore, a trench is formed in the top epitaxial layer L4. The third epitaxial layer L3 comprising SiP is substantially unchanged due to the relatively strong selectivity between SiAs (comprised in top epitaxial layer) and SiP. A wavy top surface (having at least two crests and a valley between and below the two crests as shown in FIG. 12A) of the third epitaxial layer L3 is exposed from the trench and a source/drain contact 280 is then directly formed over the exposed wavy top surface of the third epitaxial layer L3. As depicted in FIG. 12A, S/D contact 280 has a wavy bottom surface matching (matingly engaged with) the wavy top surface of third epitaxial layer L3 within the landing window (trench) formed in the top epitaxial layer L4. As depicted in FIG. 12B, in the X-direction, S/D contact 280 contacts the third epitaxial layer L3 which contacts both the first epitaxial layer L1 and the second epitaxial layer L2. In the depicted embodiment, the top (fourth) epitaxial layer L4 of epitaxial feature 250-2 surrounds a lower portion of S/D contact 280. The top (fourth) epitaxial layer L4 includes three surfaces: surface L4S1 contacting the lower portion of the sidewall of S/D contact 280; surface L4S2 contacting a portion of the third epitaxial layer L3; and surface L4S3 contacting ILD 270. As depicted in FIG. 12A, the bottom surface of S/D contact 280 has substantially the same wavy profile as at least a portion of the top surface of the third epitaxial layer L3. The wavy contact surface has at least two crests and a valley between and below the two crests. The crests and the valley of the wavy contact surface enlarges the contact surface between S/D contact 280 and epitaxial S/D feature 250-2 compare to the conventional flat contact surface between the S/D contact and the epitaxial S/D feature. Therefore, the contact resistance between the S/D contact and the epitaxial S/D feature is reduced and the performance of device 200 is improved.

FIGS. 13A and 13B provides a device 200 having a three-layer epitaxial S/D feature 250-3 in a p-type region. Epitaxial S/D feature 250-3 includes a first epitaxial layer L1, a second epitaxial layer L2, and a third epitaxial layer L3. In the depicted embodiment, epitaxial layers L1 and L2 both comprise silicon germanium (SiGe), but with different molar ratios of germanium (Ge). For example, a molar ratio of Ge in the first epitaxial layer L1 is less than about 40%; and a molar ratio of Ge in the second epitaxial layer L2 is about 40% to about 100%. In the depicted embodiment, the third epitaxial layer L3 is the top epitaxial layer and includes SiAs, wherein, for example, a molar ratio of As in the third epitaxial layer L3 is about 2% to about 10%. In some embodiments, a doping concentration of As in L3 is about $1 \times 10^{22}$ to about $1 \times 10^{23}$ atoms/cm$^3$ (a molar ratio of As is about 2% to about 10%). In some embodiments, the epitaxial growth process may be a LPCVD process with a silicon-based precursor, a selective epitaxial growth (SEG) process, or a cyclic deposition and etching (CDE) process. For example, silicon crystal may be grown with LPCVD with dichlorosilane (SiH$_2$Cl$_2$) as the precursor. For another example, silicon germanium crystal may be formed with a CDE process using HCl as the etching gas and a gas mixture of GeH$_4$ and H$_2$ as the deposition gas. Furthermore, epitaxial layers L1-L3 may be doped in-situ (during the epitaxial growth process) or ex-situ (after the epitaxial growth process is completed) with one or more p-type dopants, such as boron or indium. Similar as epitaxial S/D feature 250-1, a thickness T1 of the first epitaxial layer L1 is about 1 nm to about 10 nm; a thickness T2 of the second epitaxial layer L2 is about 10 nm to about 40 nm; and a thickness T3 of the third epitaxial layer L3 is about 0.1 nm to about 20 nm. Thus, a thickness ratio of the top (third) epitaxial layer L3 to the bottom (first) epitaxial layer L1 is about 0.01 to about 20; and a thickness ratio of the top (third) epitaxial layer L3 to the second epitaxial layer L2 is about 0.0025 to about 2. In some embodiment, a ratio of the thickness of the top (third) epitaxial layer L3 comprising SiAs to the height of epitaxial S/D features 250-3 (T1+T2+T3) is about 1% to about 20%. As depicted in FIGS. 13A and 13B, epitaxial S/D features 250-3 has a merge width W1 in the Y-direction and a width W2 in the X-direction. In some embodiments, the merge width W1 is about 5 nm to about 100 nm, and the width W2 is about 5 nm to about 25 nm. In some embodiments, a ratio of the thickness T3 of the top epitaxial layer L3 to the merge width W1 of epitaxial S/D features 250-3 is about 0.001 to about 4, and a ratio of the thickness T3 of the top epitaxial layer L3 to a width W2 of epitaxial S/D features 250-3 is about 0.004 to about 4.

Referring to FIGS. 14A and 14B, portions of top epitaxial layer L3 comprising SiAs are removed by a process, for example, an anisotropical chlorine-based plasma etching process. Second epitaxial layer L2 comprising SiGe is substantially unchanged due to the relatively strong selectivity between SiAs (comprised in top epitaxial layer) and SiGe. A wavy top surface of the second epitaxial layer L2 is exposed and then source/drain contact 280 is then formed directly over the second epitaxial layer L2. S/D contact 280 has a wavy bottom surface matching (e.g., matingly engaged with) the wavy top surface of second epitaxial layer L2 within the landing window (trench) formed in the top epitaxial layer L3. As depicted in FIG. 14B, S/D contact 280 contacts both the first epitaxial layer L1 and the second epitaxial layer L2 in the X-direction. In the depicted embodiment, the top (third) epitaxial layer L3 surrounds a lower portion of S/D contact 280. The top (third) epitaxial layer L3 includes three surfaces: surface L3S1 contacting the lower portion of the sidewall of S/D contact 280; surface L3S2 contacting a portion of the second epitaxial layer L2; and surface L3S3 contacting ILD 270. As depicted in FIG. 14A, the bottom surface of S/D contact 280 has substantially the same wavy profile as at least a portion of the top surface of the second epitaxial layer L2. The wavy contact surface has at least two crests and a valley between and below the two crests. The crests and the valley of the wavy contact surface enlarges the contact surface between S/D contact 280 and epitaxial feature 250-3 compare to the conventional flat contact surface between the S/D contact and the epitaxial S/D feature. Therefore, the contact resistance between the S/D contact and the epitaxial S/D feature is reduced and the performance of device 200 is improved.

FIGS. 15A and 15B provide a device 200 having a four-layer epitaxial S/D feature 250-4 in a p-type region. Epitaxial S/D feature 250-4 comprises a first epitaxial layer L1, a second epitaxial layer L2, a third epitaxial layer L3, and a fourth epitaxial layer L4. The structure profile of epitaxial S/D feature 250-4 is very similar as epitaxial S/D feature 250-2 as discussed above regarding FIGS. 11A and 11B. However, the materials of epitaxial S/D feature 250-4 is different than that of epitaxial S/D feature 250-2. In the depicted embodiment, epitaxial layers L1-L3 all comprise SiGe, but with different molar ratios of Ge. For example, a molar ratio of Ge in the first epitaxial layer L1 is less than about 40%; a molar ratio of Ge in the second epitaxial layer L2 is about 40% to about 60%; and a molar ratio of Ge in the third epitaxial layer L3 is about 60% to about 100%. In the depicted embodiment, the fourth epitaxial layer L4 is the top epitaxial layer and includes SiAs, wherein, for example, a molar ratio of As in the fourth epitaxial layer L4 is about 2% to about 10%. In some embodiments, a doping concentration of As in L4 is about $1 \times 10^{22}$ to about $1 \times 10^{23}$ atoms/cm$^3$. Forming process of epitaxial S/D feature 250-4 is similar as that of the epitaxial S/D feature 250-3. In some embodiments, a thickness T1 of the first epitaxial layer L1 is about 1 nm to about 10 nm; a thickness T2 of the second epitaxial layer L2 is about 10 nm to about 40 nm; a thickness T3 of the third epitaxial layer L3 is about 10 nm to about 40 nm; and a thickness T4 of the fourth epitaxial layer L4 is about 0.1 nm to about 20 nm. Thus, a thickness ratio of the top (fourth) epitaxial layer L4 to the bottom (first) epitaxial layer L1 is about 0.01 to about 20; a thickness ratio of the top (fourth) epitaxial layer L4 to the second epitaxial layer L2 is about 0.0025 to about 2; and a thickness ratio of the top (fourth) epitaxial layer L4 to the third epitaxial layer L3 is about 0.0025 to about 2. In some embodiment, a ratio of the thickness of the top (fourth) epitaxial layer L4 comprising SiAs to the height of epitaxial S/D features 250-4 (T1+T2+T3+T4) is about 1% to about 20%. As depicted in FIGS. 11A and 11B, epitaxial S/D features 250-4 has a merge width W1 in the Y-direction and a width W2 in the X-direction. In some embodiments, the merge width W1 is about 5 nm to about 100 nm, and the width W2 is about 5 nm to about 25 nm. In some embodiments, a ratio of the thickness T4 of the top epitaxial layer L4 to the merge width W1 of epitaxial S/D features 250-4 is about 0.001 to about 4, and a ratio of the thickness T4 of the top epitaxial layer L4 to a width W2 of epitaxial S/D features 250-4 is about 0.004 to about 4.

Referring to FIGS. 16A and 16B, portions of top epitaxial layer L4 comprising SiAs are removed by a process, for example, an anisotropical chlorine-based plasma etching process. The third epitaxial layer L3 comprising SiGe is substantially unchanged due to the relatively strong selectivity between SiAs (comprised in top epitaxial layer) and SiGe. A wavy top surface of the third epitaxial layer L3 is exposed and source/drain contact 280 is then formed over the third epitaxial layer L3. S/D contact 280 has a wavy bottom surface matching (matingly engaged with) the wavy top surface of third epitaxial layer L3 within the landing window (trench) formed in the top epitaxial layer L4. As depicted in FIG. 16B, in the X-direction, S/D contact 280 contacts the third epitaxial layer L3 which contacts both the first epitaxial layer L1 and the second epitaxial layer L2. In the depicted embodiment, the top (fourth) epitaxial layer L4 of epitaxial feature 250-4 surrounds a lower portion of S/D contact 280. The top (fourth) epitaxial layer L4 includes three surfaces: surface L4S1 contacting the lower portion of the sidewall of S/D contact 280; surface L4S2 contacting a portion of the third epitaxial layer L3; and surface L4S3 contacting ILD 270. As depicted in FIG. 16A, the bottom surface of S/D contact 280 has substantially the same wavy profile as at least a portion of the top surface of the third epitaxial layer L3. The wavy contact surface has at least two crests and a valley between and below the two crests. The crests and the valley of the wavy contact surface enlarges the contact surface between S/D contact 280 and epitaxial S/D feature 250-4 compare to the conventional flat contact surface between the S/D contact and the epitaxial S/D feature. Therefore, the contact resistance between the S/D contact and the epitaxial S/D feature is reduced and the performance of device 200 is improved.

Although not intended to be limiting, one or more embodiments of the present disclosure provide many benefits to a semiconductor device and a formation process thereof. For example, embodiments of the present disclosure form semiconductor device comprising an epitaxial S/D feature with a top epitaxial layer of SiAs or other pentavalent silicon compound which has a relatively strong etching selectivity from lower epitaxial layer(s) (for example, comprising Si, SiC, SiP, or SiGe) of the epitaxial S/D feature. Relatively strong etching selectivity between the top epitaxial layer and the lower epitaxial layer(s) can protect the lower epitaxial layer(s) from being damaged in the S/D contact etching process. In addition, the relatively strong etching selectivity between the top epitaxial layer and the lower epitaxial layer(s) can achieve a more efficient and/or more complete etching of the top epitaxial layer, so that the source/drain contact can have a wavy contact profile with the lower epitaxial layers of the epitaxial S/D feature. The wavy contact profile results in a larger contact surface between the source/drain contact and the epitaxial S/D feature, thus the contact resistance is reduced, and the performance of the semiconductor device is improved.

The present disclosure provides for many different implementations. Semiconductor device having a wavy contact surface between the S/D feature and the S/D contact and methods of fabrication thereof are disclosed herein. An exemplary integrated circuit device includes a fin disposed over a substrate, wherein the fin includes a channel region and a source/drain region; a gate structure disposed over the substrate and over the channel region of the fin; a source/drain feature epitaxially grown in the source/drain region of the fin, wherein the source/drain feature includes a top epitaxial layer and a lower epitaxial layer formed below the top epitaxial layer, and the lower epitaxial layer includes a wavy top surface; and a contact having a wavy bottom surface matingly engaged with the wavy top surface of the lower epitaxial layer of the source/drain feature.

In some implementations, the top epitaxial layer of the source/drain feature includes a pentavalent silicon compound and the lower epitaxial layer of the source/drain feature includes a material different than the pentavalent silicon compound of the top epitaxial layer. In some further implementations, the pentavalent silicon compound of the top epitaxial layer includes silicon arsenide (SiAs). In some further implementations, a molar ratio of arsenic (As) in the SiAs is about 2% to about 10%.

In some implementations, the top epitaxial layer includes a first surface contacting a sidewall of the contact, a second surface contacting the lower epitaxial layer, and a third surface contacting an interlayer dielectric (ILD) layer. In some further implementations, the wavy top surface of the lower epitaxial layer includes crests and a valley between and below the crests, the crests and the valley are within a trench formed by the first surface of the top epitaxial layer.

In some implementations, a ratio of a thickness of the top epitaxial layer to a height of the source/drain feature is about 1% to about 20%. In some implementations, a ratio of a thickness of the top epitaxial layer to a thickness of the lower epitaxial layer is about 0.0025 to about 2.

Another integrated circuit device includes at least two fins disposed over a substrate, wherein each of the at least two fins include a channel region and a source/drain region; a gate structure disposed over the substrate and over the channel regions of the at least two fins; a source/drain feature epitaxially grown in the source/drain regions of the at least two fins, wherein the source/drain feature includes a top epitaxial layer and a lower epitaxial layer formed below the top epitaxial layer, the lower epitaxial layer extending to wrap the at least two fins, the top epitaxial layer including a pentavalent silicon compound different than a material of the lower epitaxial layer; and a contact directly formed over a top surface of the lower epitaxial layer of the source/drain feature.

In some implementations, the pentavalent silicon compound of the top epitaxial layer includes silicon arsenide (SiAs) and a material of the lower epitaxial layer include silicon phosphide (SiP) or silicon germanium (SiGe). In some implementations, the top surface of the lower epitaxial layer is a wavy top surface including crests and a valley between and below the crests, and the contact has a wavy bottom surface matingly engaged with the wavy top surface of the lower epitaxial layer. In some implementations, the top epitaxial layer surrounds a lower portion of a sidewall of the contact. In some implementations, the source/drain feature further includes bottom epitaxial layers disposed below the lower epitaxial layer and wrap each of the at least two fins respectively, a ratio of a thickness of the top epitaxial layer to a thickness of the bottom epitaxial layer is about 0.01 to about 20.

An exemplary method includes forming a plurality of fins over a substrate, wherein each of the plurality of fins comprises a channel region and a source/drain region; forming a gate structure over the substrate and over the channel regions of the plurality of fins; epitaxially forming a source/drain feature including a top epitaxial layer and a lower epitaxial layer over the source/drain regions of at least two adjacent fins, wherein the top and lower epitaxial layers have different etching selectivities; etching a portion of the top epitaxial layer of the source/drain feature to form a trench to expose a wavy top surface of the lower epitaxial layer of the source/drain feature; forming a contact over the wavy top surface of the lower epitaxial layer within the trench.

In some implementations, epitaxially forming a source/drain feature comprises epitaxially forming a lower feature over the source/drain region of each of the at least two adjacent fins, wherein the lower features of the at least two adjacent fins merged together to form the lower epitaxial layer having a wavy top surface; and epitaxially forming the top epitaxial layer over the wavy top surface of the lower epitaxial layer. In some further implementations, forming the top epitaxial layer comprises forming the top epitaxial layer to a thickness of about 0.1 to about 20 nanometers.

In some implementations, the top epitaxial layer includes a pentavalent silicon compound.

In some implementations, epitaxially forming a source/drain feature comprises forming a bottom feature over the source/drain region of each of the at least two adjacent fins before forming the lower epitaxial layer, wherein the bottom features of the at least two adjacent fins merged together to form a bottom epitaxial layer; forming the lower epitaxial layer over the bottom epitaxial layer, wherein the lower epitaxial layer having a wavy top surface; and forming the top epitaxial layer over the wavy top surface of the lower epitaxial layer.

In some implementations, removing a portion of the top epitaxial layer comprises a chlorine(Cl)-based plasma etching process to substantially completely remove a portion of the top epitaxial layer between crests and above a valley of the wavy surface of the lower epitaxial layer. In some further implementations, the Cl-based plasma etching process includes removing the portion of the top epitaxial layer using a gas mixture of chlorine and boron trichloride with a power density of about 0.1 W/cm2 to about 1 W/cm2 and at a pressure of about 10 to about 20 mTorr.

The foregoing outlines features of several implementations so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the implementations introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a fin disposed over a substrate, wherein the fin includes a channel region and a source/drain region;
a gate structure disposed over the substrate and over the channel region of the fin;
a source/drain feature epitaxially grown in the source/drain region of the fin, wherein the source/drain feature includes a top epitaxial layer and a lower epitaxial layer formed below the top epitaxial layer, and the lower epitaxial layer includes a wavy top surface; and
a contact having a wavy bottom surface matingly engaged with the wavy top surface of the lower epitaxial layer of the source/drain feature.

2. The semiconductor device of claim 1, wherein the top epitaxial layer of the source/drain feature includes a pentavalent silicon compound and the lower epitaxial layer of the source/drain feature includes a material different than the pentavalent silicon compound of the top epitaxial layer.

3. The semiconductor device of claim 2, wherein the pentavalent silicon compound of the top epitaxial layer includes silicon arsenide (SiAs).

4. The semiconductor device of claim 3, wherein a molar ratio of arsenic (As) in the SiAs is about 2% to about 10%.

5. The semiconductor device of claim 1, wherein the top epitaxial layer includes a first surface contacting a sidewall of the contact, a second surface contacting the lower epitaxial layer, and a third surface contacting an interlayer dielectric (ILD) layer.

6. The semiconductor device of claim 5, wherein the wavy top surface of the lower epitaxial layer includes crests and a valley between and below the crests, the crests and the valley are within a trench formed by the first surface of the top epitaxial layer.

7. The semiconductor device of claim 1, wherein a ratio of a thickness of the top epitaxial layer to a height of the source/drain feature is about 1% to about 20%.

8. The semiconductor device of claim 1, wherein a ratio of a thickness of the top epitaxial layer to a thickness of the lower epitaxial layer is about 0.0025 to about 2.

9. A semiconductor device, comprising:
at least two fins disposed over a substrate, wherein each of the at least two fins include a channel region and a source/drain region;
a gate structure disposed over the substrate and over the channel regions of the at least two fins;
a source/drain feature epitaxially grown in the source/drain regions of the at least two fins, wherein the source/drain feature includes a top epitaxial layer and a lower epitaxial layer formed below the top epitaxial layer, the lower epitaxial layer extending to wrap the at least two fins, the top epitaxial layer including a pentavalent silicon compound different than a material of the lower epitaxial layer; and
a contact directly formed over a top surface of the lower epitaxial layer of the source/drain feature such that the contact matingly engages the top surface of the lower epitaxial layer of the source/drain feature.

10. The semiconductor device of claim 9, wherein the pentavalent silicon compound of the top epitaxial layer includes silicon arsenide (SiAs) and a material of the lower epitaxial layer include silicon phosphide (SiP) or silicon germanium (SiGe).

11. The semiconductor device of claim 9, wherein the top surface of the lower epitaxial layer is a wavy top surface including crests and a valley between and below the crests, and the contact has a wavy bottom surface matingly engaged with the wavy top surface of the lower epitaxial layer.

12. The semiconductor device of claim 9, wherein the top epitaxial layer surrounds a lower portion of a sidewall of the contact.

13. The semiconductor device of claim 9, wherein the source/drain feature further includes bottom epitaxial layers disposed below the lower epitaxial layer and wrap each of the at least two fins respectively, a ratio of a thickness of the top epitaxial layer to a thickness of the bottom epitaxial layer is about 0.01 to about 20.

14. A device comprising:
a fin structure disposed on a substrate;
a source/drain feature disposed on the fin structure, the source/drain feature including:
a first epitaxial layer disposed on the fin structure;
a second epitaxial layer disposed on the first epitaxial layer, the second epitaxial layer formed of a different material that the second epitaxial layer;
a third epitaxial layer disposed on the second epitaxial layer, the third epitaxial layer including a pentavalent silicon compound; and
a fourth epitaxial layer disposed directly on the fin structure, the fourth epitaxial layer formed of a different material that the first and second epitaxial layers.

15. The device of claim 14, wherein the second epitaxial layer has a wavy top surface and the bottom surface of the third epitaxial layer interfaces with the wavy top surface of the of the second epitaxial layer.

16. The device of claim 15, further comprising a contact feature extending through the third epitaxial layer and interfacing with the wavy top surface of the of the second epitaxial layer.

17. The device of claim 14, wherein the first epitaxial layer has a first concentration of phosphorus and the second epitaxial layer has a second concentration of phosphorus that is different than the first concentration.

18. The device of claim 14, wherein the first epitaxial layer has a first concentration of germanium and the second epitaxial layer has a second concentration of germanium that is different than the first concentration.

19. The device of claim 14, wherein the second epitaxial layer interfaces with the first epitaxial layer and the fourth epitaxial layer.

20. The device of claim 1, wherein the source/drain feature further includes:
a first epitaxial layer disposed directly on the fin; and
a second epitaxial layer disposed directly on the first epitaxial layer, and
wherein the first epitaxial layer is formed of a different material than the lower epitaxial layer and a portion of the first epitaxial layer interfaces with a portion of the lower epitaxial layer.

* * * * *